(12) United States Patent
Oh et al.

(10) Patent No.: US 12,293,967 B2
(45) Date of Patent: May 6, 2025

(54) THREE-DIMENSIONAL SEMICONDUCTOR DEVICE

(71) Applicant: SK hynix Inc., Icheon-si (KR)

(72) Inventors: Sung Lae Oh, Icheon-si (KR); Sang Woo Park, Icheon-si (KR); Dong Hyuk Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/505,998

(22) Filed: Nov. 9, 2023

(65) Prior Publication Data

US 2024/0071910 A1   Feb. 29, 2024

Related U.S. Application Data

(63) Continuation of application No. 17/467,678, filed on Sep. 7, 2021, now Pat. No. 11,848,266.

(30) Foreign Application Priority Data

Apr. 6, 2021   (KR) ........................ 10-2021-0044510

(51) Int. Cl.
*H01L 23/522*   (2006.01)
*H01L 21/768*   (2006.01)
*H01L 23/528*   (2006.01)
*H10B 69/00*   (2023.01)

(52) U.S. Cl.
CPC .... *H01L 23/5226* (2013.01); *H01L 21/76816* (2013.01); *H01L 23/5283* (2013.01); *H10B 69/00* (2023.02)

(58) Field of Classification Search
CPC ............ H01L 23/5226; H01L 23/5283; H01L 21/76816; H10B 69/00
USPC ......................................................... 257/774
See application file for complete search history.

(56) References Cited

U.S. PATENT DOCUMENTS

| | | | |
|---|---|---|---|
| 10,811,430 B2 | 10/2020 | Baek | |
| 2010/0213526 A1* | 8/2010 | Wada | ................ H01L 21/76816 257/314 |
| 2012/0238093 A1 | 9/2012 | Park et al. | |
| 2016/0064281 A1 | 3/2016 | Izumi et al. | |

FOREIGN PATENT DOCUMENTS

| | | |
|---|---|---|
| CN | 105321924 A | 2/2016 |
| CN | 112310087 A | 2/2021 |
| KR | 10-2013-0072522 A | 7/2013 |
| KR | 10-2015-0031288 A | 3/2015 |
| KR | 10-2017-0031288 A | 3/2017 |
| KR | 10-2017-0115753 A | 10/2017 |

* cited by examiner

Primary Examiner — Tu-Tu V Ho

(57) ABSTRACT

A three-dimensional semiconductor device may comprise a first cell region, a second cell region, and a via plug region disposed between the first cell region and the second cell region; a word line stack disposed in the first cell region, the via plug region, and the second cell region, the word line stack including a plurality of word lines and a plurality of interlayer insulating layers which are alternately stacked; and a plurality of via plugs exclusively connected to the plurality of the word lines, respectively, by vertically penetrating through the word line stack in the via plug region. The via plugs may have an arrangement of a zigzag pattern in a row direction from a top view. The diameters of the via plugs may increase in the row direction.

19 Claims, 26 Drawing Sheets

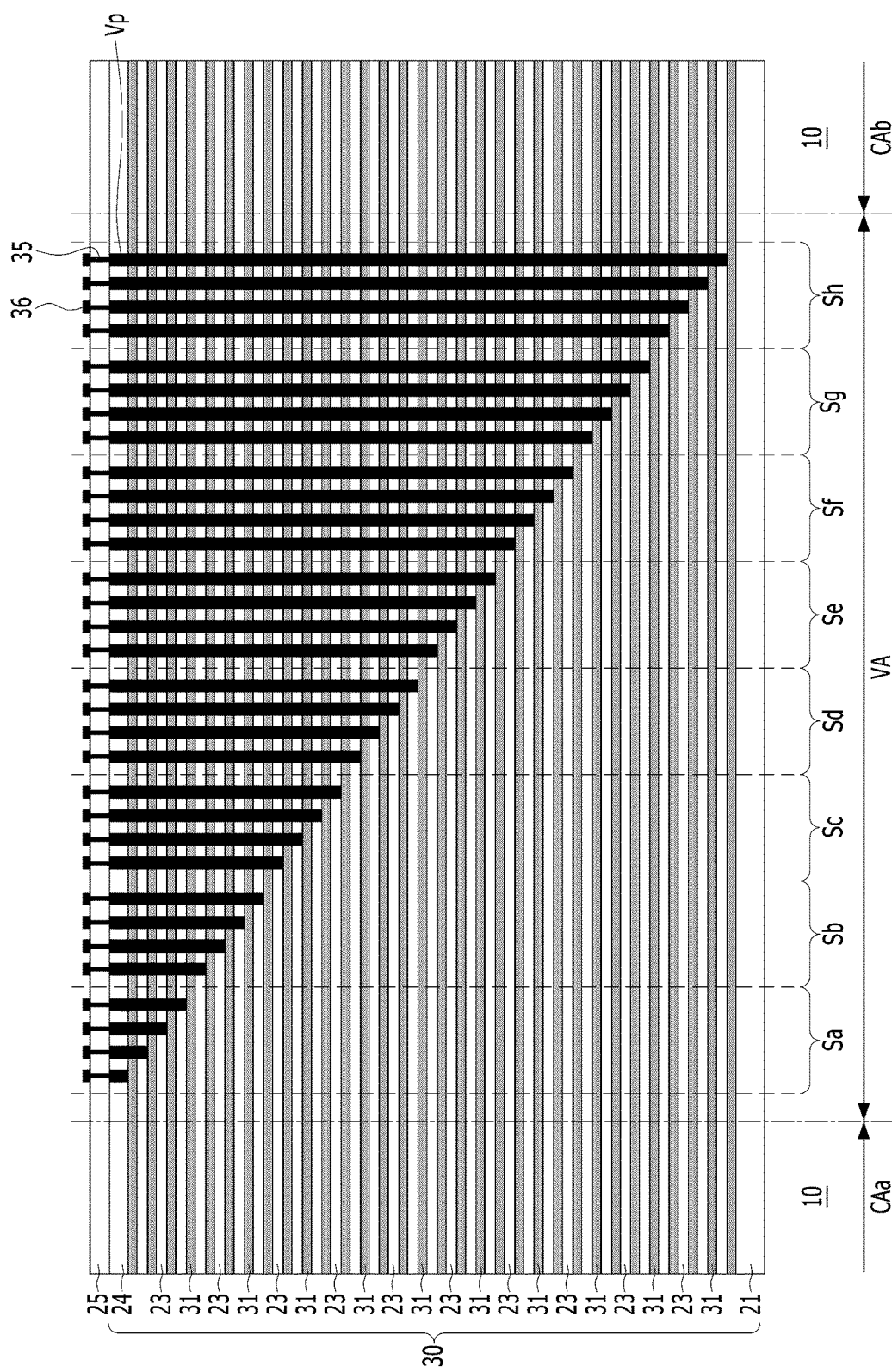

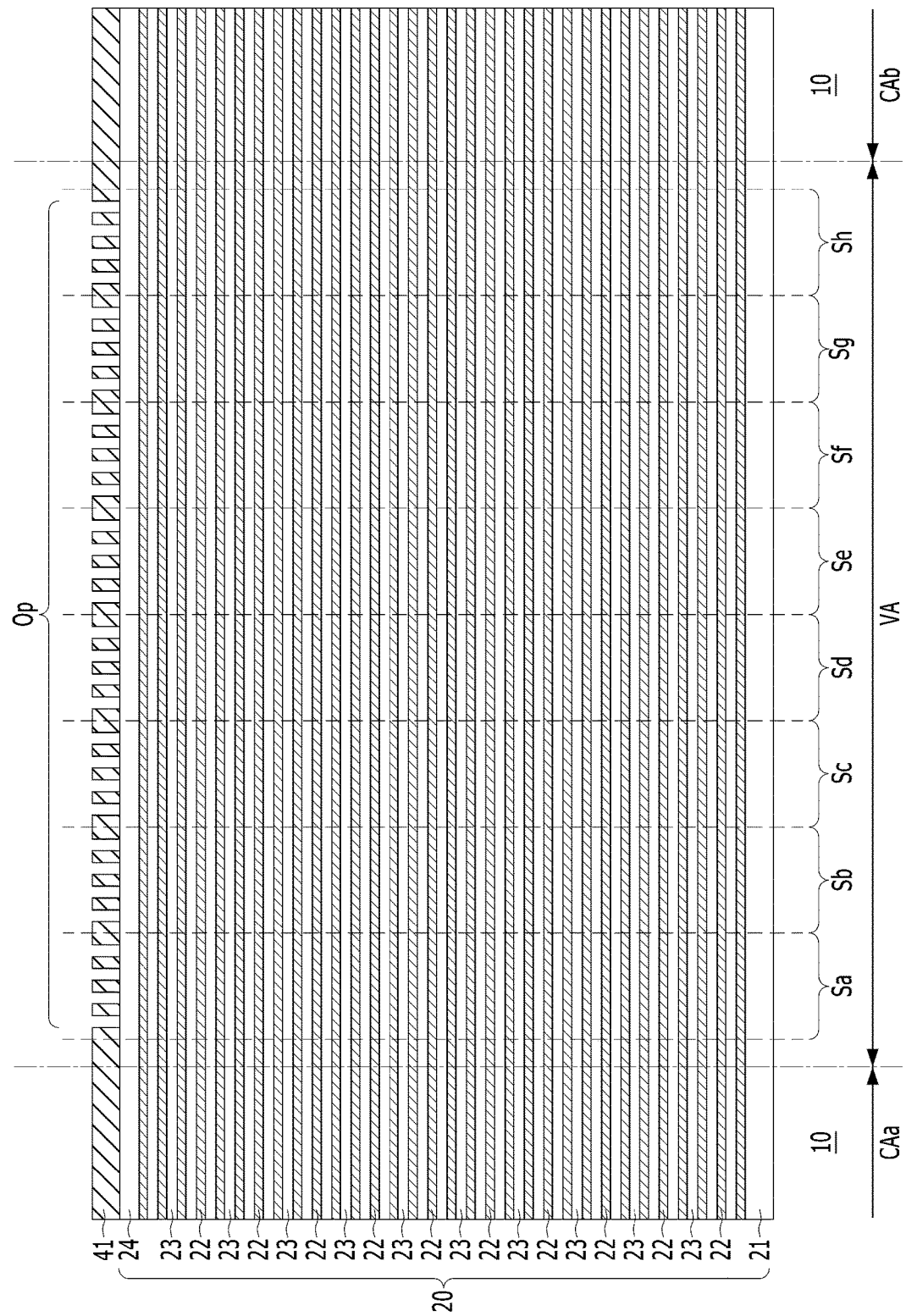

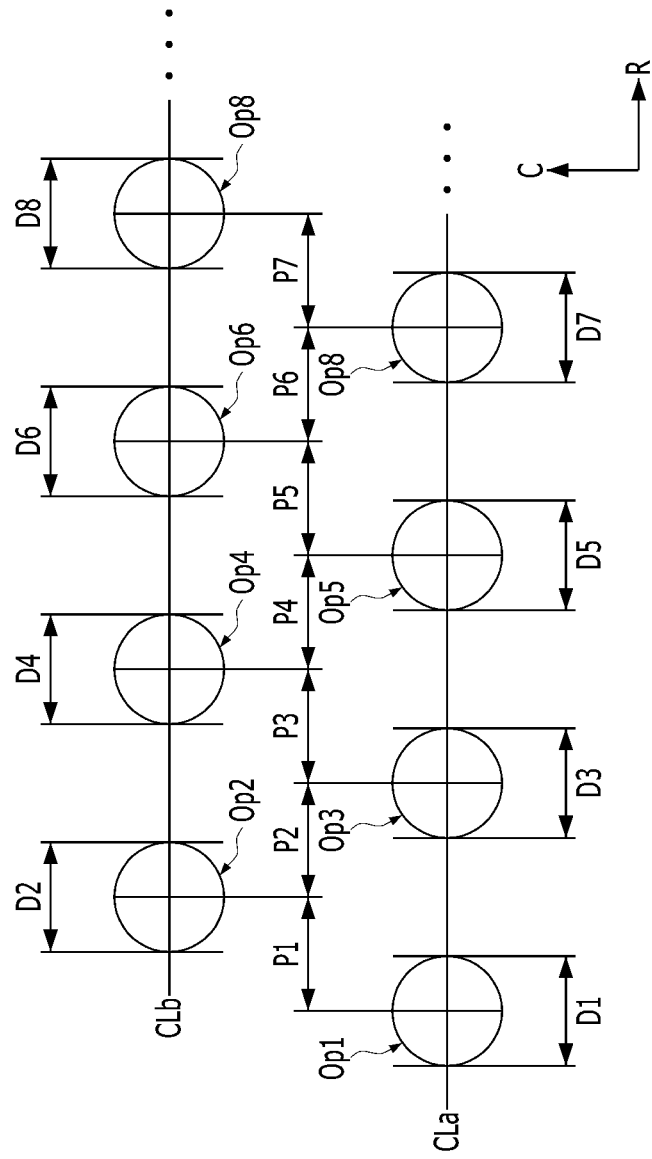

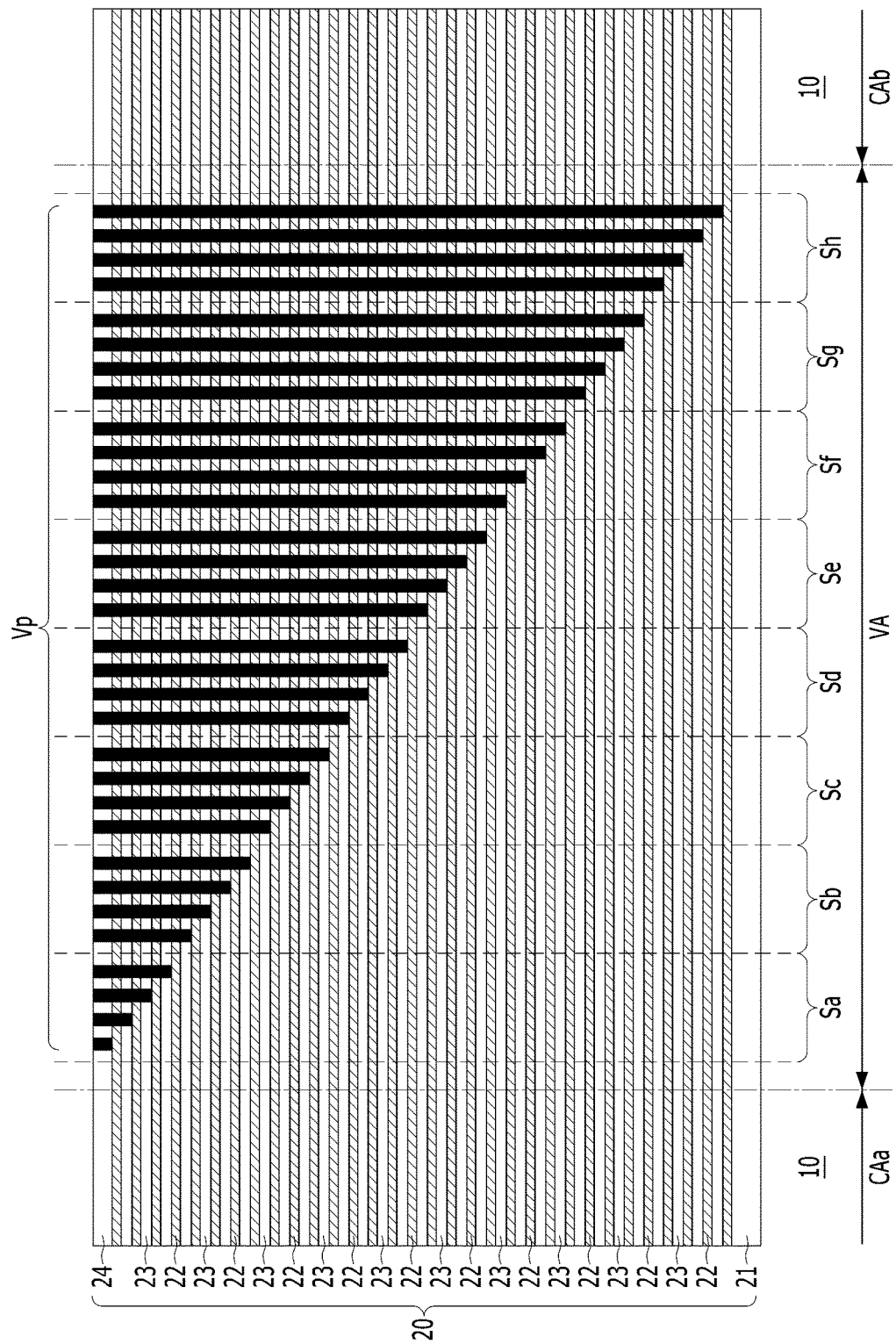

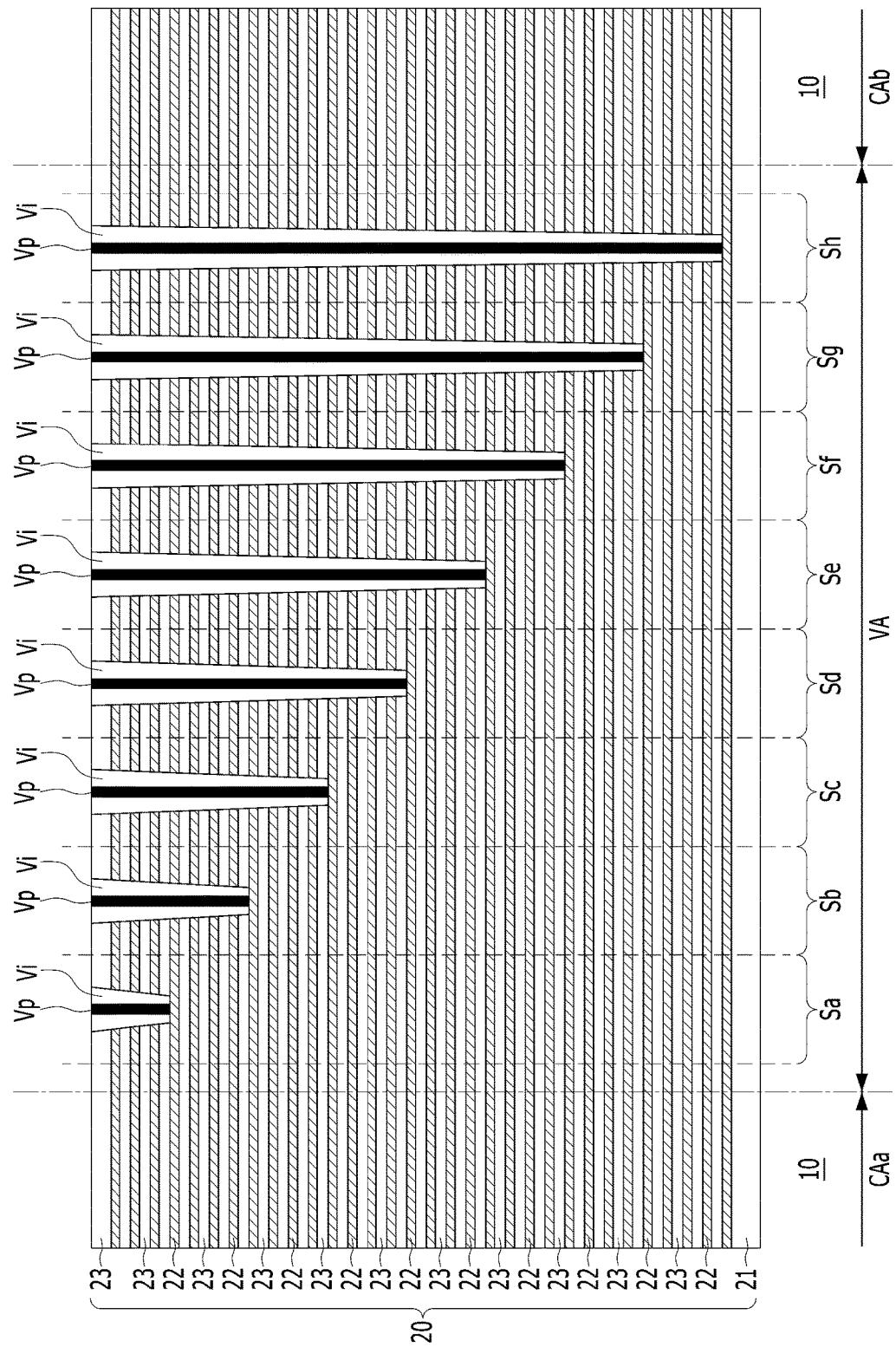

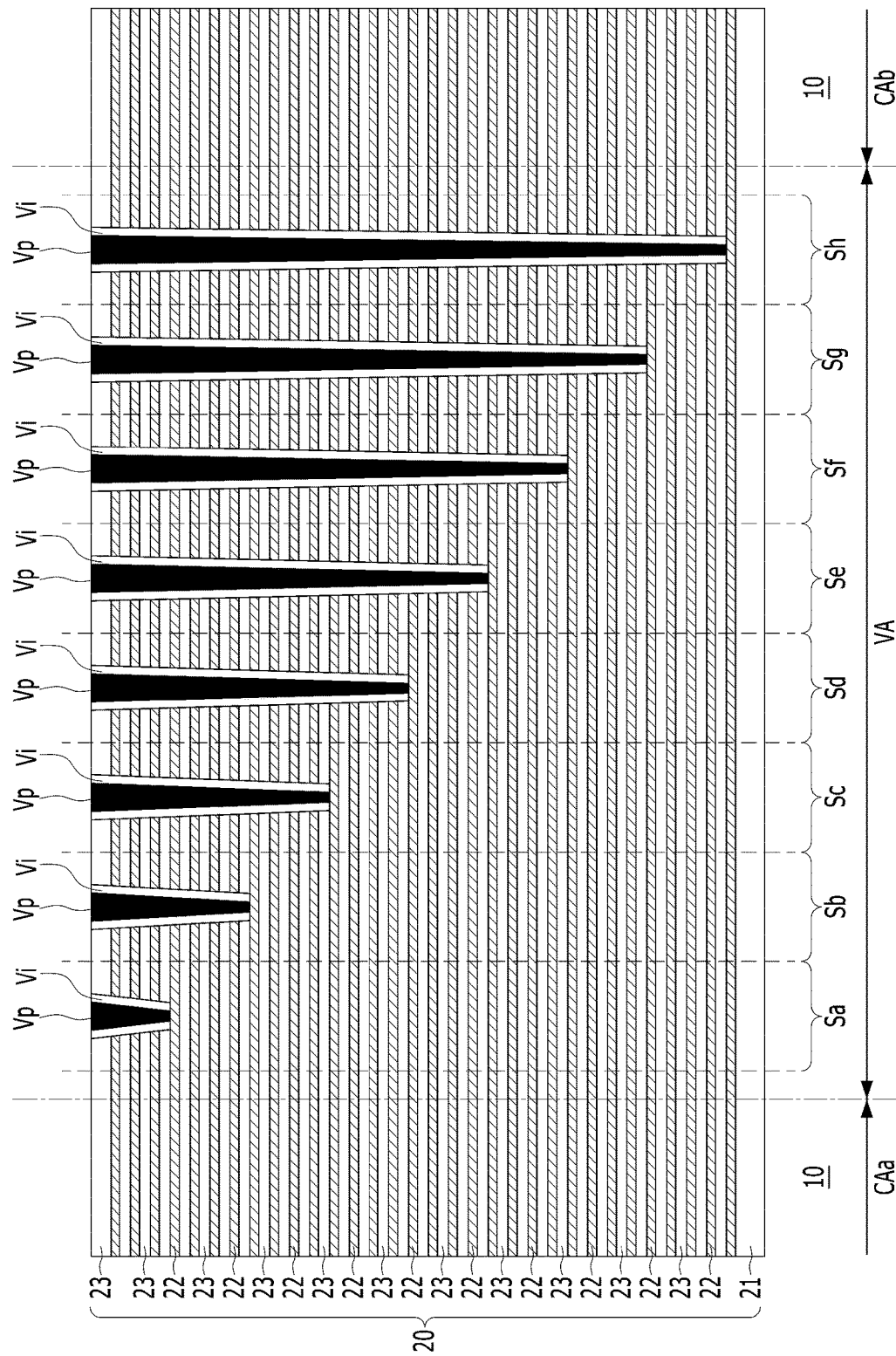

THREE-DIMENSIONAL SEMICONDUCTOR DEVICE

CROSS-REFERENCE TO RELATED APPLICATIONS

The present application is a continuation application of a U.S. patent application Ser. No. 17/467,678, filed on Sep. 7, 2021, which claims priority under 35 U.S.C. § 119 to Korean Patent Application No. 10-2021-0044510, filed on Apr. 6, 2021, which is herein incorporated by reference in its entirety.

BACKGROUND

1. Field

The present disclosure relates to a three-dimensional semiconductor device including a plurality of via plugs, having different vertical lengths, that are arranged in a zigzag pattern.

2. Description of the Related Art

Recently, the increases in capacity and miniaturization of the three-dimensional semiconductor devices are ongoing. As a result, signal delay and voltage drop phenomena due to stacking of three-dimensional semiconductor devices are emerging as particular problems.

SUMMARY

Embodiments of the present invention are to provide a three-dimensional semiconductor device including a via plug region disposed between cell regions and a method for fabricating the same.

Embodiments of the present invention are to provide a three-dimensional semiconductor device in which cells in cell regions share the same word line and a method for fabricating the same.

Embodiments of the present invention are to provide a three-dimensional semiconductor device having via plugs arranged in a zigzag pattern in a via plug region and a method for fabricating the same.

Embodiments of the present invention are to provide a three-dimensional semiconductor device including via plugs having different diameters and a method for fabricating the same.

According to an embodiment of the present invention, a three-dimensional semiconductor device may comprise a first cell region, a second cell region, and a via plug region disposed between the first cell region and the second cell region; a word line stack disposed in the first cell region, the via plug region, and the second cell region, the word line stack including a plurality of word lines and a plurality of interlayer insulating layers which are alternately stacked; and a plurality of via plugs exclusively connected to the plurality of the word lines, respectively, by vertically penetrating through the word line stack in the via plug region. The via plugs may be arranged in a zigzag pattern in a row direction from a top view. The diameters of the via plugs may increase in the row direction.

According to an embodiment of the present invention, a three-dimensional semiconductor device may comprise a first cell region, a second cell region, and a via plug region disposed between the first cell region and the second cell region; a word line stack disposed in the first cell region, the via plug region, and the second cell region, the word line stack including a plurality of word lines and a plurality of interlayer insulating layers that are alternately stacked; and a plurality of via plugs exclusively connected to the plurality of the word lines, respectively, by vertically penetrating through the word line stack. All of the word lines may laterally extend from the first cell region across the via plug region to the second cell region. The plurality of via plugs may have an arrangement of a zigzag pattern in a row direction from a top view.

According to an embodiment of the present invention, a three-dimensional semiconductor device may comprise a first cell region and a via plug region; a word line stack disposed in the first cell region and the via plug region, the word line stack including a plurality of word lines and a plurality of interlayer insulating layers which are alternately stacked; and a plurality of via plugs exclusively connected to the plurality of the word lines, respectively, by vertically penetrating the word line stack in the via plug region. All of the word lines may laterally extend from the first cell region to the via plug region. Diameters of the plurality of via plugs may increase in a row direction from a top view.

Cells in two cell regions may be controlled with a single word line control circuit since a three-dimensional semiconductor device according to the embodiments of the present invention includes a via plug region disposed between cell regions.

In a three-dimensional semiconductor device according to the embodiments of the present invention, the area occupied by the device may be reduced because the cells in a cell region share the same word line.

In a three-dimensional semiconductor device according to the embodiments of the present invention, the area occupied by the device may be reduced because the via plugs are arranged in a zigzag pattern within the via plug region.

Accordingly, the productivity of the device can be increased and the unit cost can be lowered.

BRIEF DESCRIPTION OF THE DRAWINGS

FIG. 2 is a longitudinal cross-sectional view of a three-dimensional semiconductor device according to an embodiment of the present invention.

FIGS. 3A to 18 are diagrams illustrating a method of fabricating a three-dimensional semiconductor device according to an embodiment of the present invention.

DETAILED DESCRIPTION

Figure 1A:
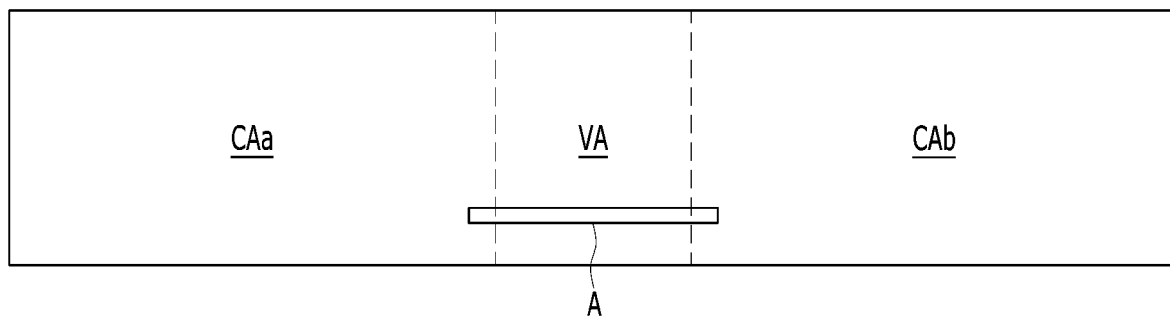
FIGS. 1A and 1B are layouts illustrating cell regions and via plug regions of three-dimensional semiconductor devices according to embodiments of the present invention.
Figure 18:
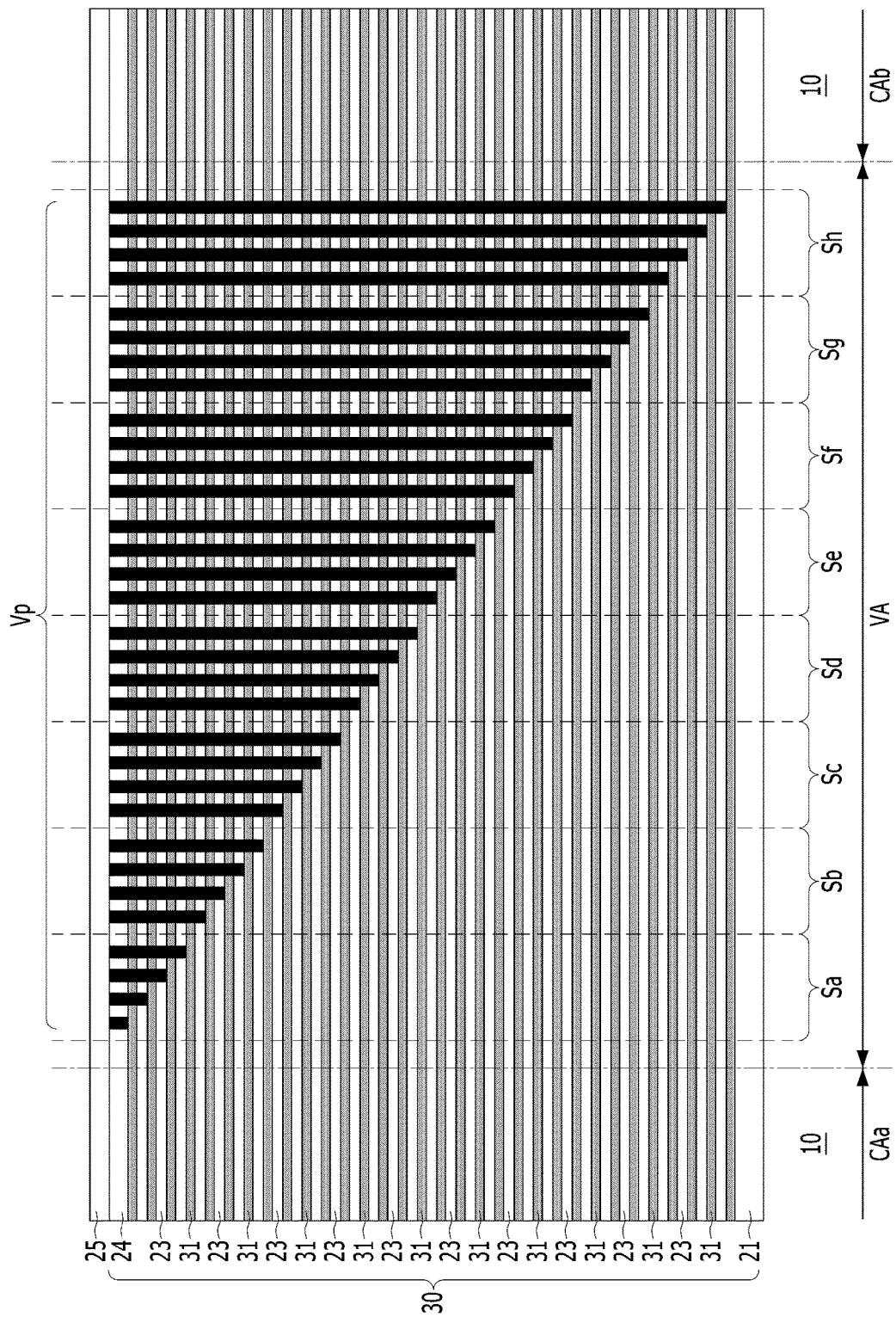

FIGS. 1A and 18 are layouts illustrating cell regions CAa and CAb and via plug regions VA of three-dimensional semiconductor devices according to embodiments of the present invention. Referring to FIG. 1A, a via plug region VA may be disposed between cell regions CAa and CAb. The cell regions CAa and CAb may include memory cells. The cell regions CAa and CAb may include a first cell region CAa located on one side of the via plug region VA and a second cell region CAb located on the other side of the via plug region VA. The via plug region VA may include via plugs to be connected to a decoding circuit controlling word lines. The cell regions CAa and CAb and the via plug region VA may be disposed or arranged side-by-side in a first direction.

Figure 1B:
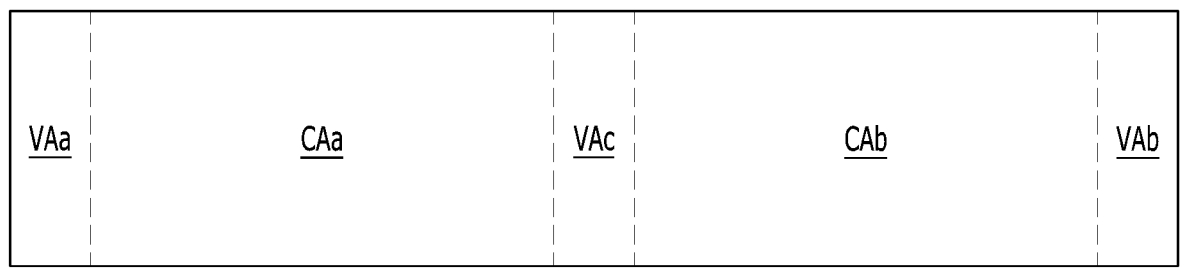

Referring to FIG. 1B, via plug regions VAa, VAb, and VAc may be distributed to be adjacent to side edges of the cell regions CAa and CAb in the first direction. For example, the via plug regions VAa, VAb, and VAc may include a first via plug region VAa adjacent to a left-side edge of the first cell region CAa, a second via plug region VAb adjacent to a right-side edge of the second cell region CAb, and a third via plug region VAc between the first cell region CAa and the second cell region CAb. The memory cells in each of the cell regions CAa and CAb may be connected to one of the via plug regions VAa, VAb, and VAc located adjacent to the cell regions.

Figure 1C:
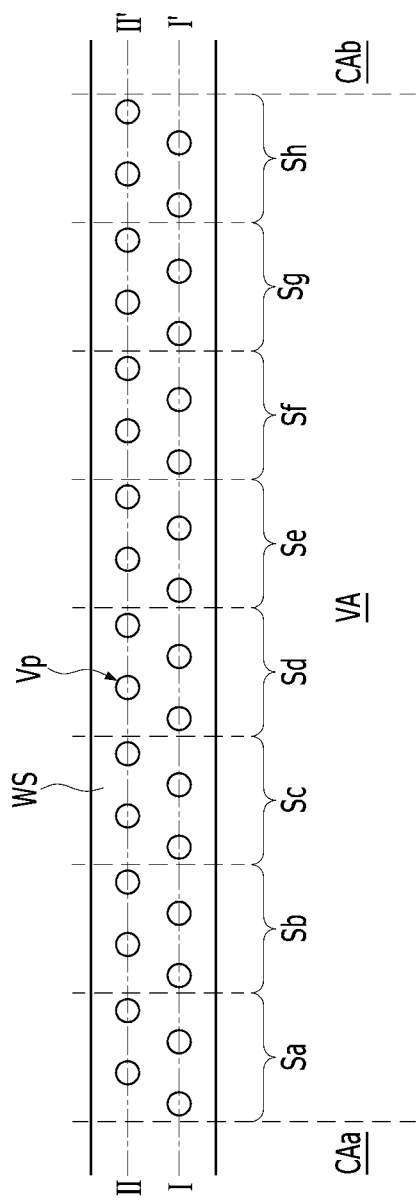
FIG. 1C is a layout illustrating an enlarged view of region A of FIG. 1A.

FIG. 1C is a layout illustrating an enlarged view of region A of FIG. 1A. Referring to FIG. 1C, the via plug region VA may be divided into a plurality of sites Sa to Sh arranged in a row direction R. The three-dimensional semiconductor device may include a plurality of via plugs Vp disposed in the plurality of sites Sa to Sh in the via plug region VA. The same number of via plugs Vp may be disposed in each of the sites Sa to Sh. The via plugs Vp may be disposed to vertically penetrate through a word line stack WS, which extends in the row direction from the first cell region CAa to the second cell region CAb across the via plug region VA. The via plugs Vp may be alternately arranged in a zigzag pattern in the row direction. There may be more or fewer of the plurality of sites Sa to Sh than shown. For example, the number of the sites Sa to Sh may be seven or less, or nine or more. In the drawing, each of the sites Sa to Sh is shown to have four via plugs Vp, but the present invention is not limited thereto. For example, each of the sites Sa to Sh may include five or more via plugs Vp, or may include less than four via plugs Vp.

Figure 1D:
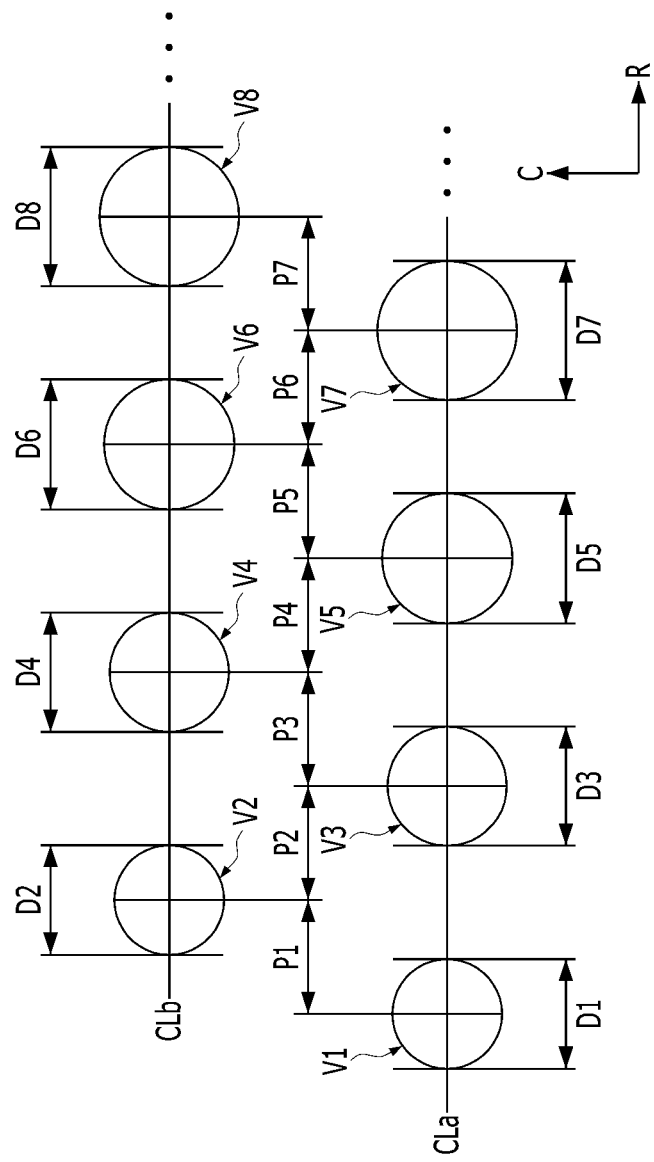
FIG. 1D is a layout illustrating the diameters of a plurality of via plugs disposed in one of a plurality of sites of FIG. 1C.

FIG. 1D is a layout illustrating diameters D1 to D8 of a plurality of via plugs V1 to V8 disposed in one of the plurality of sites Sa to Sh illustrated in FIG. 1C. Referring to FIG. 1D, the diameters D1 to D8 of first to eighth via plugs V1 to V8 disposed in each of the sites Sa to Sh may gradually increase in the row direction R. In an embodiment, eight via plugs V1 to V8 may be placed in each of the plurality of sites Sa to Sh and may be arranged in a zigzag pattern. For example, the eight via plugs V1 to V8 may be arranged in two rows illustrated by lower center line CLa and upper center line CLb. The two rows of via plugs V1 to V8 may be offset relative to each other due to the zigzag pattern. Two adjacent diameters from among the diameters D1 to D8 of the via plugs V1 to V8 may decrease in size in the row direction R, but the diameters D1 to D8 of the via plugs V1 to V8 may increase overall in the row direction R (an increasing trend). In the zigzag pattern, the centers of the lower via plugs V1, V3, V5, and V7 may be aligned with the lower center line CLa, and the centers of the upper via plugs V2, V4, V6, and V8 may be aligned with the upper center line CLb. The row direction pitches P1 to P7 or the row direction gaps between the centers of the via plugs V1 to V8 may be the same in the row direction R. In some parts or some embodiments, the diameters D1 to D8 of the via plugs V1 to V8 may be larger than the row direction pitches P1 to P7. That is, some of the via plugs V1 to V8 may partially overlap with each other in the column direction C, as illustrated in FIG. 1D. In another embodiment, the row direction pitches P1 to P7 may increase in the row direction R. While some of the adjacent row direction pitches in the row direction R may decrease, the pitches P1 to P7 overall may increase in the row direction R.

Figure 1E:
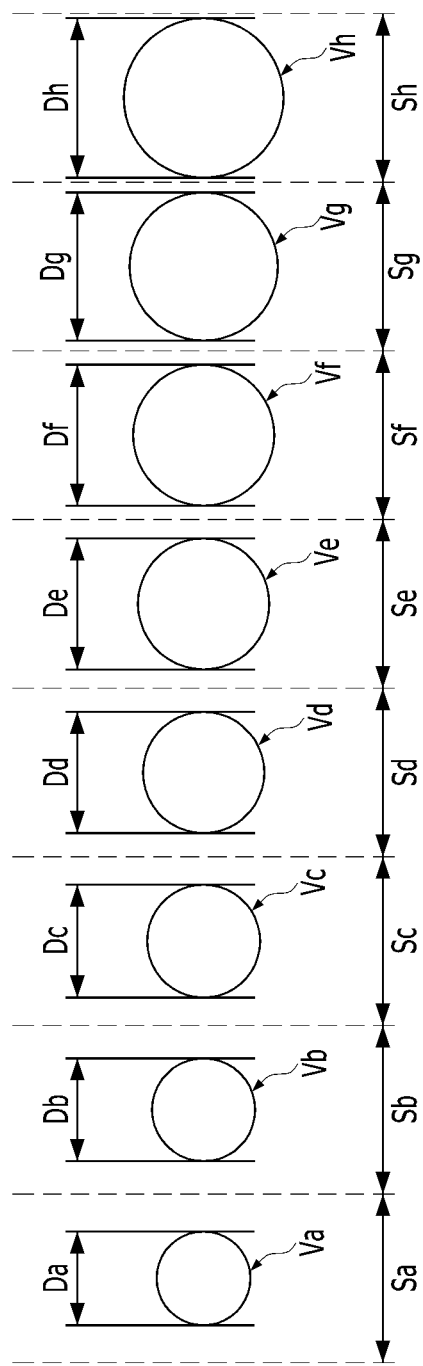
FIG. 1E is a top view illustrating average diameters of via plugs disposed in a plurality of sites of FIG. 1C.

FIG. 1E is a top view illustrating average diameters Da to Dh of via plugs Va to Vh disposed in a plurality of sites Sa to Sh. With further reference to FIG. 1C, in an embodiment, the average diameters Da to Dh of the via plugs Va to Vh may increase in the row direction R, i.e., Da<Db<Dc<Dd<De<Df<Dg<Dh. In another embodiment, sites Sa to Sh may be randomly arranged. In this case, the average diameters Da to Dh of the via plugs Va to Vh may be randomly arranged without an increasing trend in diameter size in any direction. For example, the average diameters Da to Dh of the via plugs Va to Vh may be slightly different from each other. (Da≠Db≠Dc≠Dd≠De≠Df≠Dg≠Dh). In another embodiment, some of the via plugs Va to Vh may have the same diameters while some others may have different diameters, as will be described below with reference to other drawings of the present disclosure.

FIG. 2 is a longitudinal cross-sectional view of a three-dimensional semiconductor device according to an embodiment of the present invention. In FIG. 2, longitudinal cross-sectional views taken along lines I-I' and II-II' of FIG. 1C are overlapped. According to FIGS. 1A to 1E and FIG. 2, a three-dimensional semiconductor device according to an embodiment of the present invention may include a first cell region CAa, a second cell region CAb, a via plug region VA disposed between the first and second cell regions CAa and CAb, a word line stack 30, and via plugs Vp. The word line stack 30 may extend across all of the first cell region CAa, the via plug region VA, and the second cell region CAb in a row direction. The word line stack 30 may include a lower insulating layer 21 stacked on a lower layer 10, as well as a plurality of word lines 31 and a plurality of interlayer insulating layers 23 alternately stacked with each other, and an upper insulating layer 24.

Each of the first cell region CAa and the second cell region CAb may include a plurality of vertical channel structures (not shown) vertically penetrating the word line stack 30 and a plurality of memory cells. That is, each of the word lines 31 may be simultaneously turned on and turned off in the first cell region CAa and the second cell region CAb. For example, the word lines 31 may include a metal such as tungsten (W).

The word lines 31 of the word line stack 30 may laterally extend from the first cell region CAa to the second cell region CAb across the via plug region VA. That is, the word lines 31 may extend to the two cell regions CAa and CAb without being cut or disconnected in the via plug region VA. Each of the word lines 31 may be commonly connected to a plurality of memory cells disposed in the first cell region CAa and the second cell region CAb. Accordingly, memory cells in the first and the second cell regions CAa and CAb may share the word lines 31, and the word lines 31 may simultaneously turn-on and turn-off the memory cells in the first and second cell regions CAa and CAb. Referring further to FIG. 1A, an operation time delay and a difference in supply power, due to resistance and capacitance of the cells in the first and second cell regions CAa and CAb, may be minimized because the memory cells located in the first and second cell regions CAa and CAb are simultaneously turned on and turned off by the via plugs Vp and because the via plug region VA is disposed between the first and second cell regions CAa and CAb. In addition, the word line control circuit may be simplified, the occupied area of the circuit may be reduced, and the two-dimensional size of the three-dimensional semiconductor device may be reduced because one word line control circuit can simultaneously or exclusively turn on/off the memory cells in the two cell regions CAa and CAb. That is, productivity can be increased, and unit cost can be reduced because more three-dimensional semiconductor chips can be integrated on one wafer.

The lower insulating layer 21, the interlayer insulating layers 23, and the upper insulating layer 24 may include an insulating material such as silicon oxide to insulate the stacked word lines 31.

Each of the via plugs Vp may be connected to one of the word lines 31 by vertically penetrating the word line stack 30. Side surfaces of the via plugs Vp and side surfaces of the word lines 31 may be insulated. The via plugs Vp may include a conductive core having a pillar shape and an insulating liner having a cylindrical shape to surround a sidewall of the core. The conductive core may include a conductor such as a metal, and the liner may include an insulating material such as silicon oxide. In an embodiment, a barrier material such as titanium nitride may further be included between the conductive core and the liner.

Lower ends of the via plugs Vp may be exclusively and electrically connected to the word lines 31, respectively. Accordingly, the via plugs Vp may have different vertical lengths. In order to facilitate understanding of this embodiment, the vertical lengths of the via plugs Vp are described as gradually increasing, as an example. Accordingly, each of the via plugs Vp may exclusively provide a voltage or a current to a corresponding word line 31.

The lower layer 10 may include a logic device layer. For example, the lower layer 10 may include transistors disposed on the lower substrate, vertical conductive wirings, lateral conductive wirings, and a conductive common source electrode layer. The lower substrate may include a silicon layer, the transistors may include MOS transistors, and the vertical and lateral conductive wirings may include metal wirings. The conductive common source electrode layer may be provided in a plate form under the lower insulating layer 21 of the word line stack 30. The conductive common source electrode layer may include a doped polycrystalline silicon layer or a metal silicide layer. The lower layer 10 may include an insulating material such as silicon oxide or silicon nitride.

The three-dimensional semiconductor device may further include a capping insulating layer 25, contact plugs 35, and metal wirings 36. The capping insulating layer 25 may cover the word line stack 30 and the via plugs Vp. The capping insulating layer 25 may include an insulating material such as silicon oxide. The contact plugs 35 may be connected to the via plugs Vp, respectively, by penetrating through the capping insulating layer 25. The metal wirings 36 may be disposed on the capping insulating layer 25 and may be connected to the contact plugs 35, respectively. The contact plugs 35 and metal wirings may include a metal such as tungsten (W), a barrier metal such as titanium nitride (TiN), or other conductive materials.

FIGS. 3A to 18 are diagrams illustrating a method of fabricating a three-dimensional semiconductor device according to an embodiment of the present invention. In these figures, the longitudinal cross-sectional views taken along lines I-I' and II-II' in FIG. 1C are overlapped, but adjacent patterns in the drawings may be spaced apart in a diagonal direction in a plan or top view.

Referring to FIG. 3A, a method for fabricating a three-dimensional semiconductor device according to an embodiment of the present invention may include forming an insulating layer stack 20 on the lower layer 10 and a hard mask pattern 41 on the insulating layer stack 20. The insulating layer stack 20 may include a lower insulating layer 21, a plurality of sacrificial insulating layers 22 and a plurality of interlayer insulating layers 23, which are alternately stacked, and an upper insulating layer 24. The lower insulating layer 21, the interlayer insulating layers 23, and the upper insulating layer 24 may include an insulating material such as silicon oxide. The sacrificial insulating layers 22 may include an insulating material such as silicon nitride, which may have an etching selectivity with respect to the lower insulating layer 21, the interlayer insulating layers 23, and the upper insulating layer 24. The hard mask pattern 41 may have a plurality of openings Op. The insulating layer stack 20 may be divided into a first cell region CAa, a second cell region CAb, and a via plug region VA. The via plug region VA may be divided into a plurality of sites Sa to Sh.

Figure 3B:
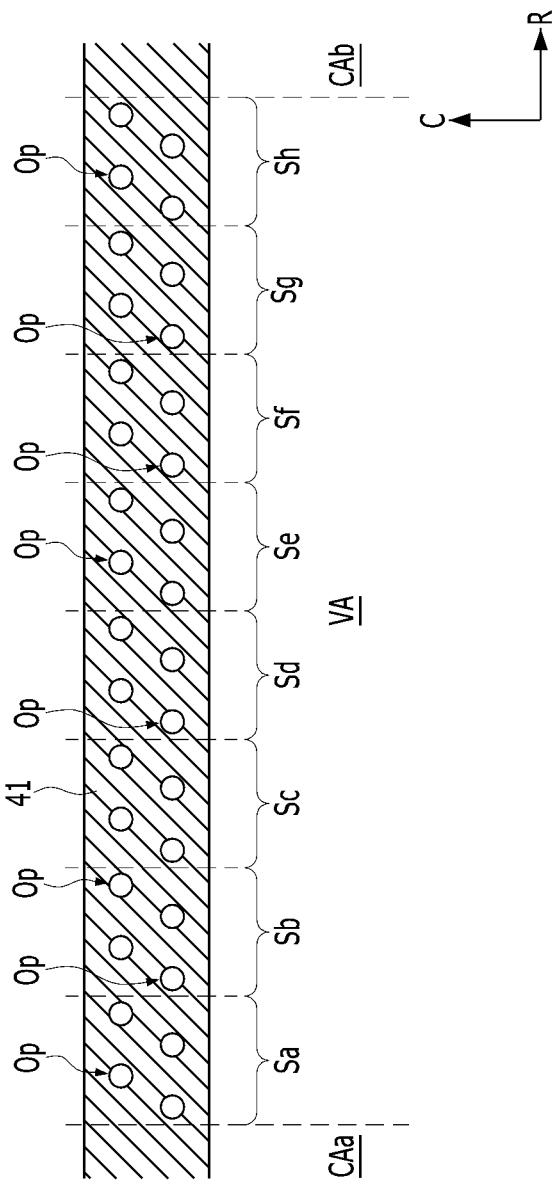

FIG. 3B is a top view illustrating an arrangement of the openings Op of the hard mask pattern 41 of FIG. 3A. Referring to FIG. 3B, the openings Op may be arranged in a zigzag pattern, such that openings Op may be offset relative to each other in a row direction R and a column direction C. The openings Op may be arranged to be spaced apart in the row direction R so as not to overlap in the column direction C because each of the openings Op in the sites Sa to Sh must be exposed, one by one, by trimming process. The same number of openings Op may be disposed in each of the sites Sa to Sh. Although four openings Op are described to be formed in each of the sites Sa to Sh, in embodiments more than four openings Op may be formed in each of the sites Sa to Sh. For example, several to tens of the openings Op may be formed in each of the sites Sa to Sh.

FIG. 3C is a layout illustrating an example of one site with diameters D1 to D8 of the plurality of openings Op of the hard mask pattern 41 disposed according to pitches P1 to P7. Referring to FIG. 3C, the diameters D1 to D8 of the respective first to eighth openings Op1 to Op8 may be the same. In addition, the pitches P1 to P7 of the respective first to eighth openings Op1 to Op8 may be the same. The pitches P1 to P7 may be larger than the diameters D1 to D8. Accordingly, in the column direction C, the openings Op may not overlap. In another embodiment, the pitches P1 to P7 may increase in magnitude along the row direction R.

Figure 4:
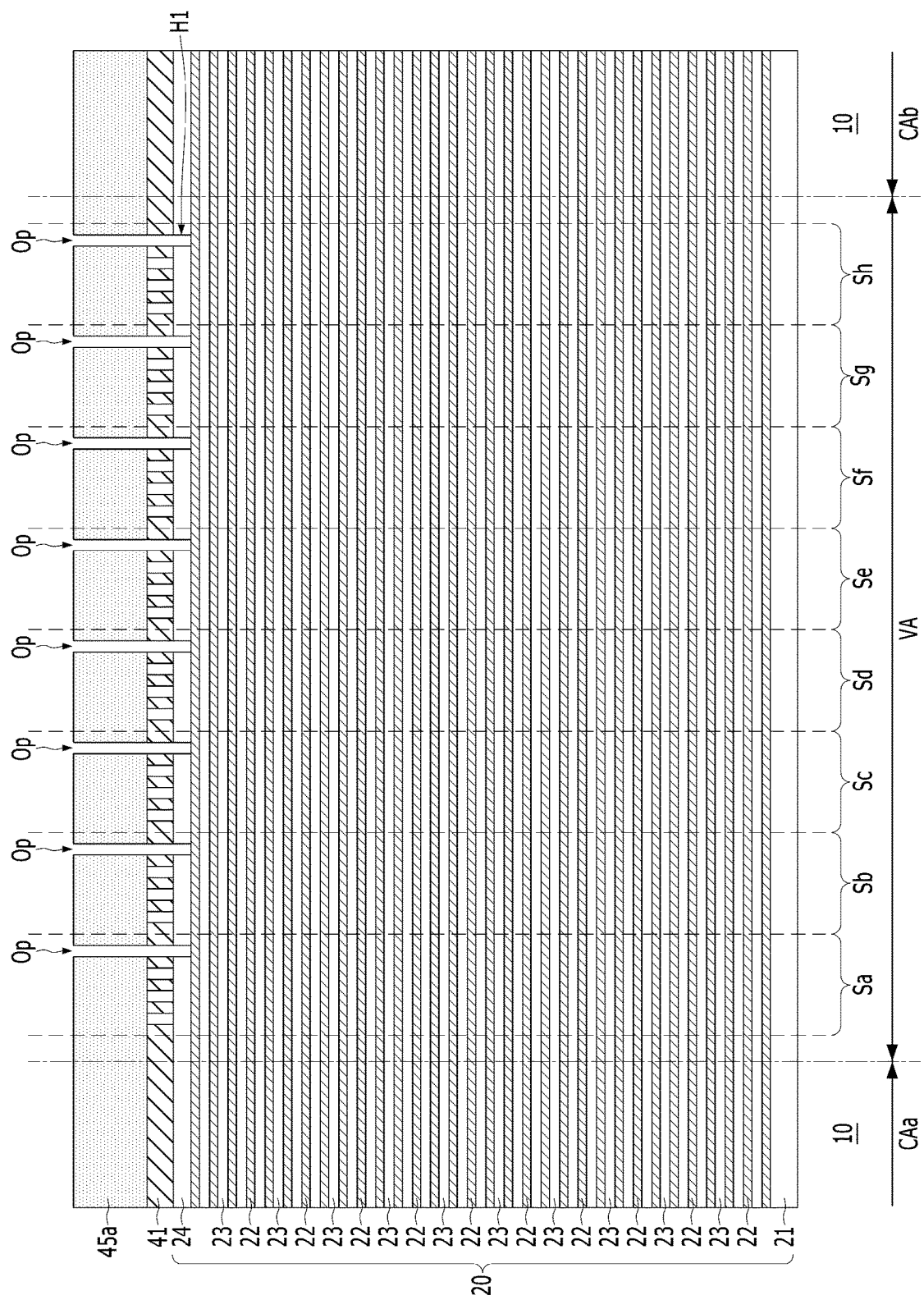

Referring to FIG. 4, the method may further include forming first hole patterns H1 in the insulating layer stack 20 by performing a first hole forming process. For example, the first hole forming process may include forming a first photoresist pattern 45a and forming the first hole patterns H1 by performing a first etching process, which uses the first photoresist pattern 45a and the hard mask pattern 41 as etching mask. The first photoresist pattern 45a may expose one of the outermost openings Op of the hard mask pattern 41 in each of the sites Sa to Sh. For example, the opening Op in each of the sites Sa to Sh that is furthest in the row direction may be exposed. The first hole patterns H1 may extend under the hard mask pattern 41 downward to the inside of the insulating layer stack 20.

Figure 5:
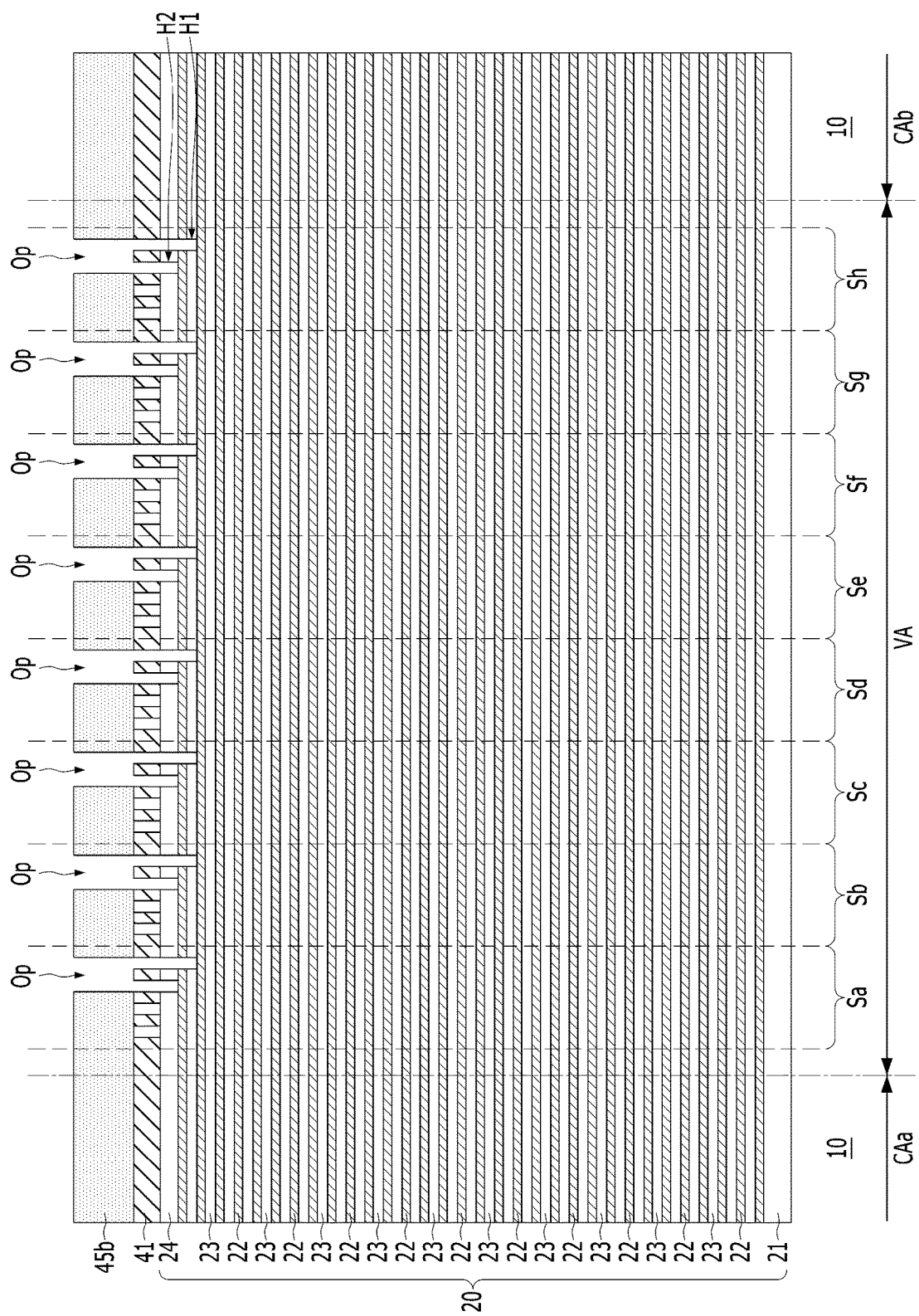

Referring to FIG. 5, the method may further include forming second hole patterns H2 in the insulating layer stack 20 by performing a second hole forming process, and further deepening the first hole patterns H1. The second hole forming process may include forming a second photoresist pattern 45*b*, which exposes the openings OP that are adjacent to the openings Op of the hard mask pattern 41 previously exposed in the first hole forming process. The second photoresist pattern 45*b* may be formed by shrinking the first photoresist pattern 45*a*, and the second hole patterns H2 and the deepened first hole patterns H1 can be formed by the second etching process using the second photoresist pattern 45*b* and the hard mask pattern 41 as etching masks.

Figure 6:
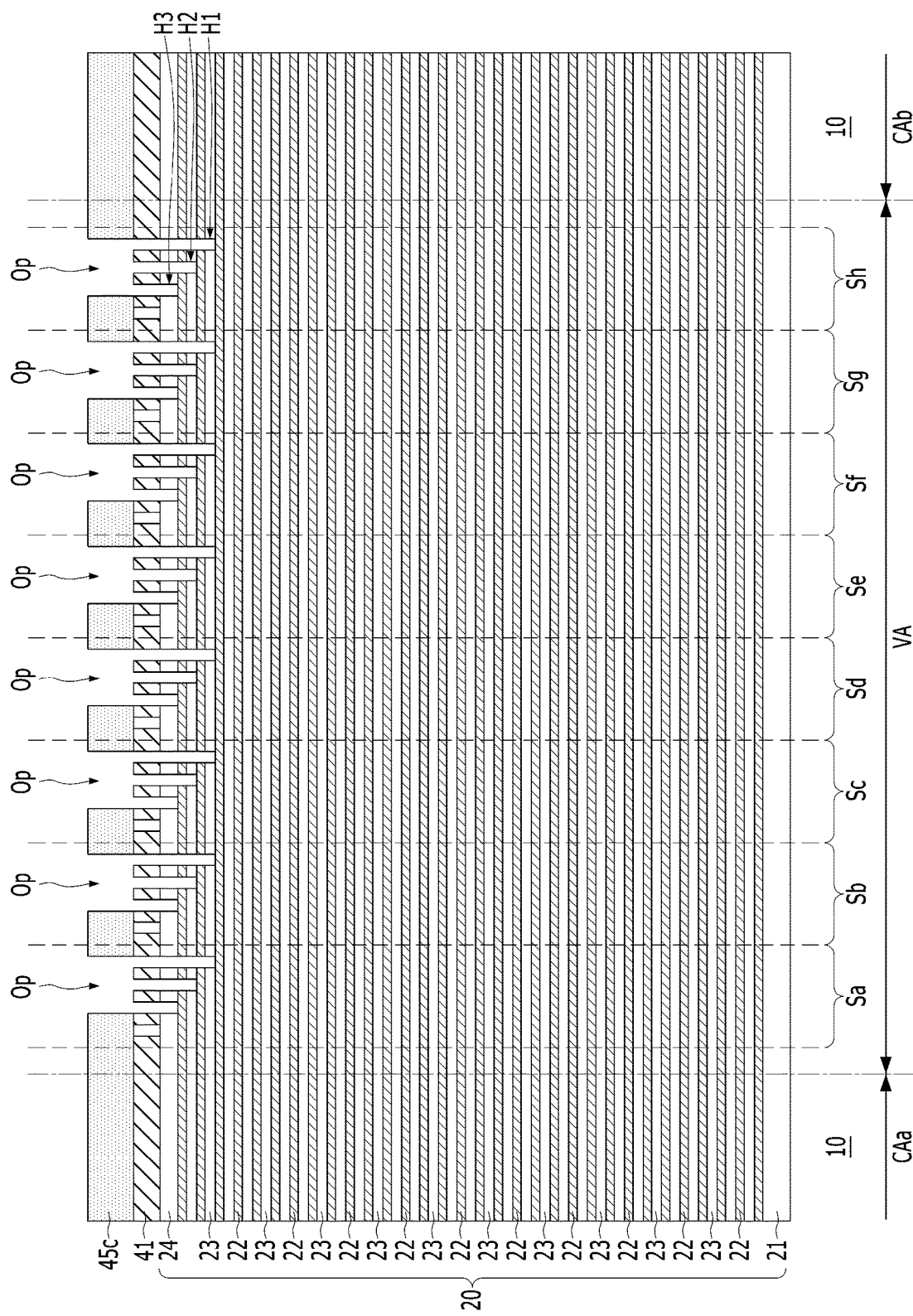
Figure 7:
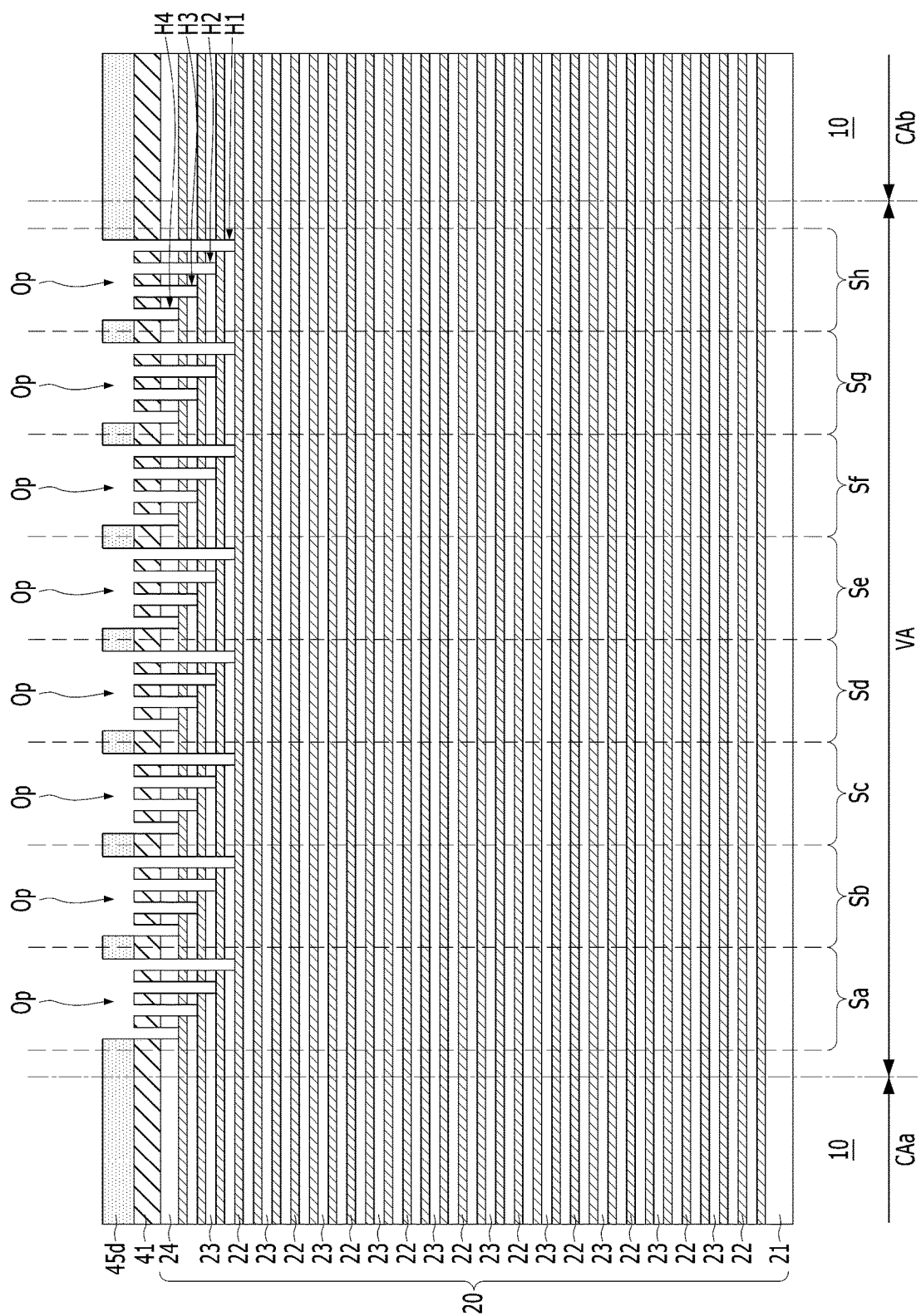

Referring to FIGS. 6 and 7, the method may further include forming third hole patterns H3 and fourth hole patterns H4 in the insulating layer stack 20 by performing a third hole forming process and a fourth hole forming process. The first hole patterns H1 and the second hole patterns H2 may further be deepened with each additional hole forming process. In the third hole forming process, the second photoresist pattern 45*b* may shrink to a third photoresist pattern 45*c* to expose additional openings Op of the hard mask pattern 41. In the fourth hole forming process, the third photoresist pattern 45*c* may shrink to a fourth photoresist pattern 45*d*, which exposes additional openings Op of the hard mask pattern 41.

In FIGS. 4 to 7, the openings Op of the hard mask pattern 41 in each of the sites Sa to Sh may be sequentially exposed in the row direction. Similar to FIG. 3C, the openings Op of the hard mask pattern 41 in each of the sites Sa to Sh may be disposed to be spaced apart in the row direction R.

As described above, four hole patterns H1 to H4 are described to be formed in each of the sites Sa to Sh, but more hole patterns may be formed in each of the sites Sa to Sh in methods disclosed herein. For example, several to tens of the hole patterns H1 to H4 may be formed in each of the sites Sa to Sh. Accordingly, the hole forming processes may be repeated until all the openings Op of the hard mask pattern 41 in each of the sites Sa to Sh are exposed.

Figure 8:
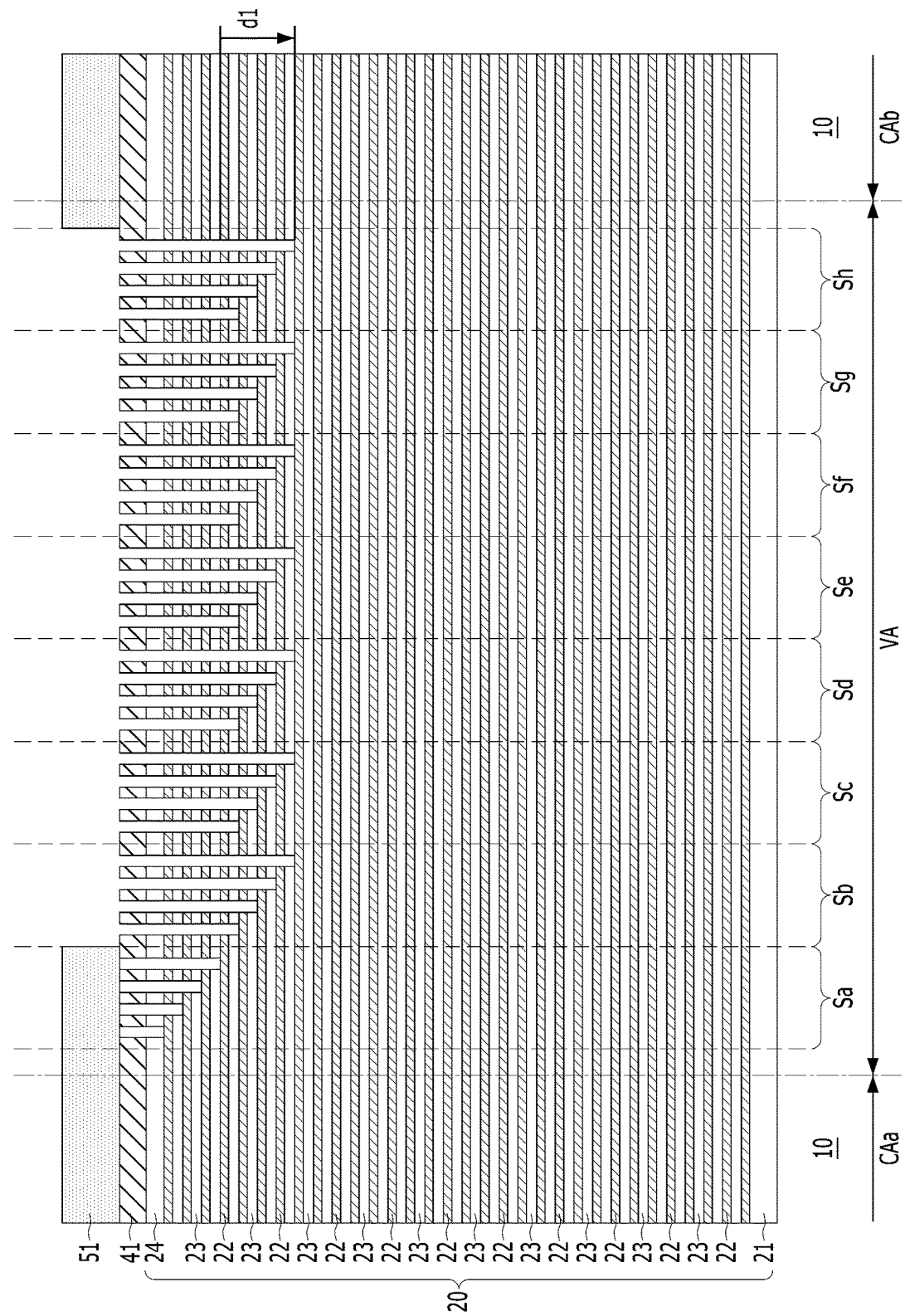

Referring to FIG. 8, the method may further include performing a first slimming process. The first slimming process may include forming a first mask pattern 51 covering one of the sites Sa to Sh (e.g., the first site Sa), exposing the remaining sites Sb to Sh, and further etching the hole patterns H1 to H4 of the exposed sites Sb to Sh by a first depth d1. Thereafter, the first mask pattern 51 may be removed, and a filling insulating material may fill in the hole patterns H1 to H4. Reference numerals for the filling insulation materials have been omitted to simplify the drawings.

Figure 9:
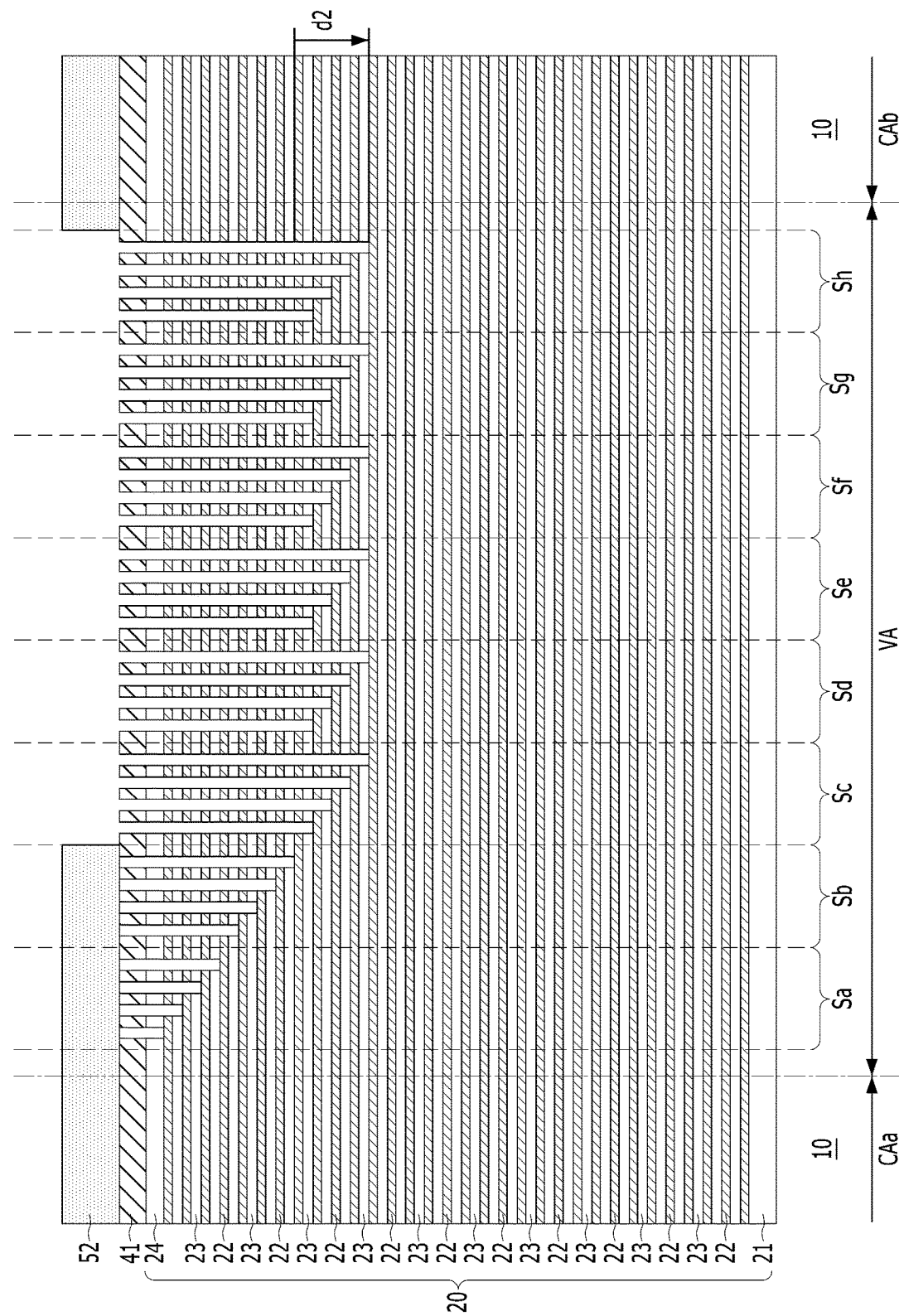
Figure 10:
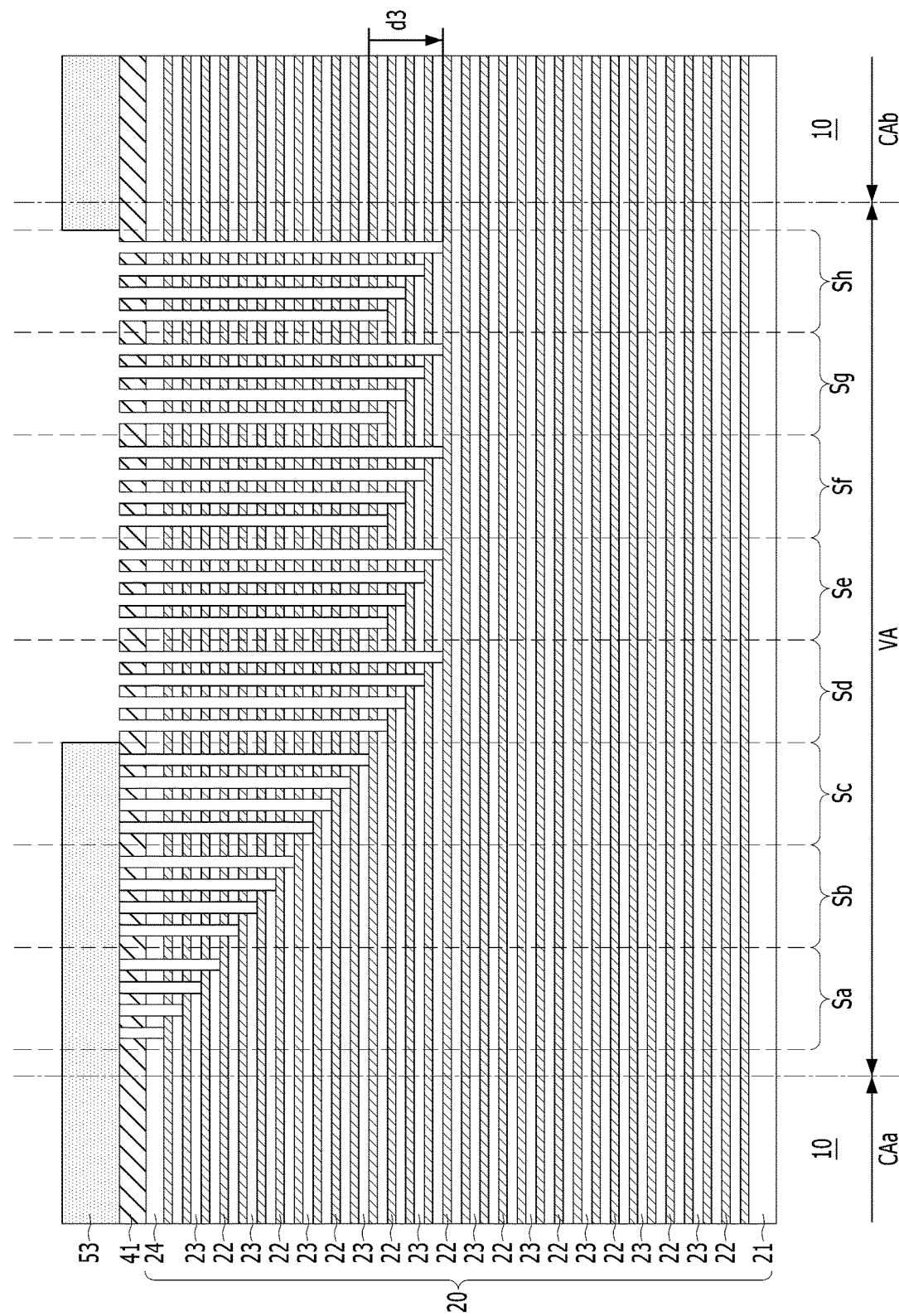
Figure 11:
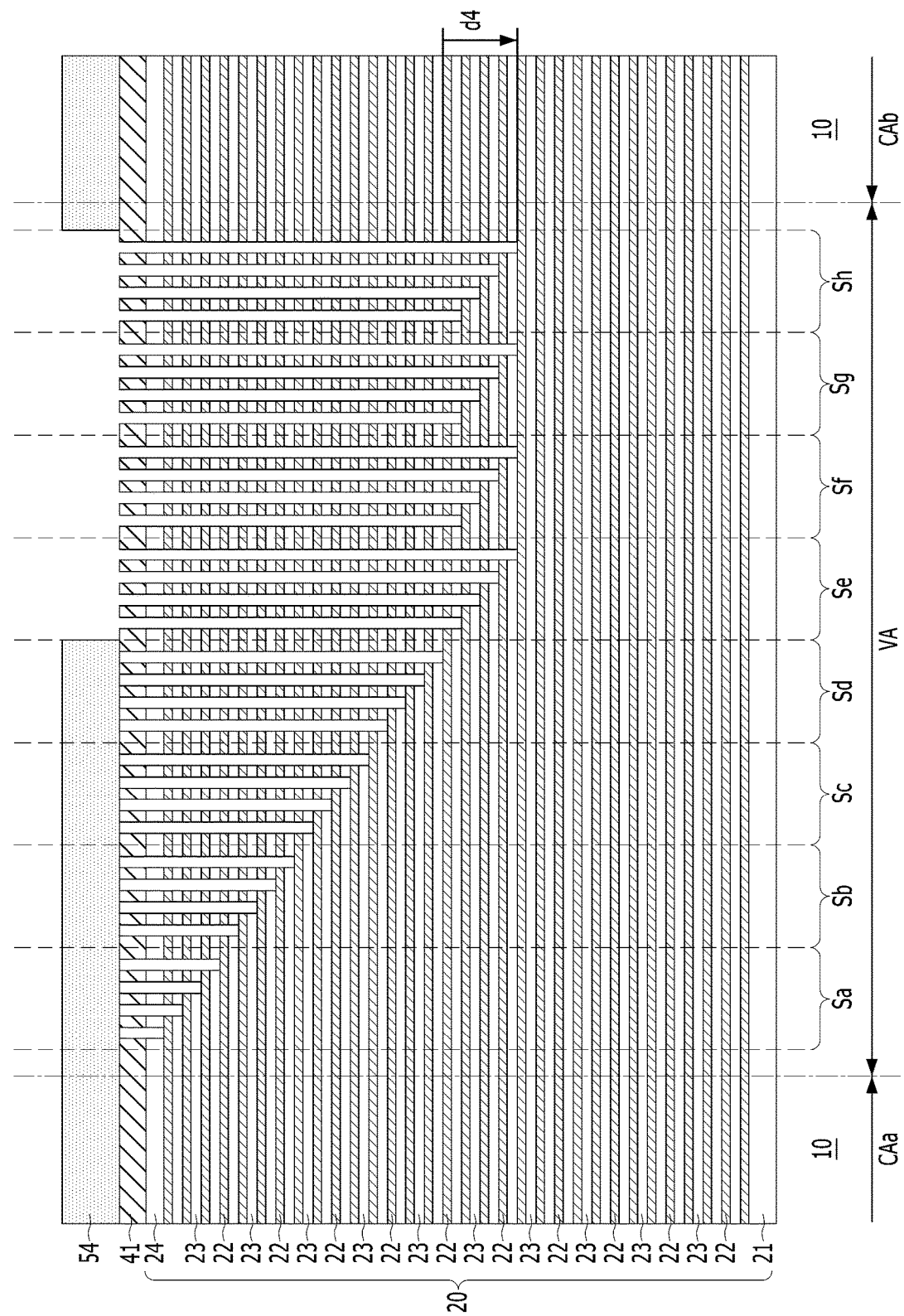
Figure 12:
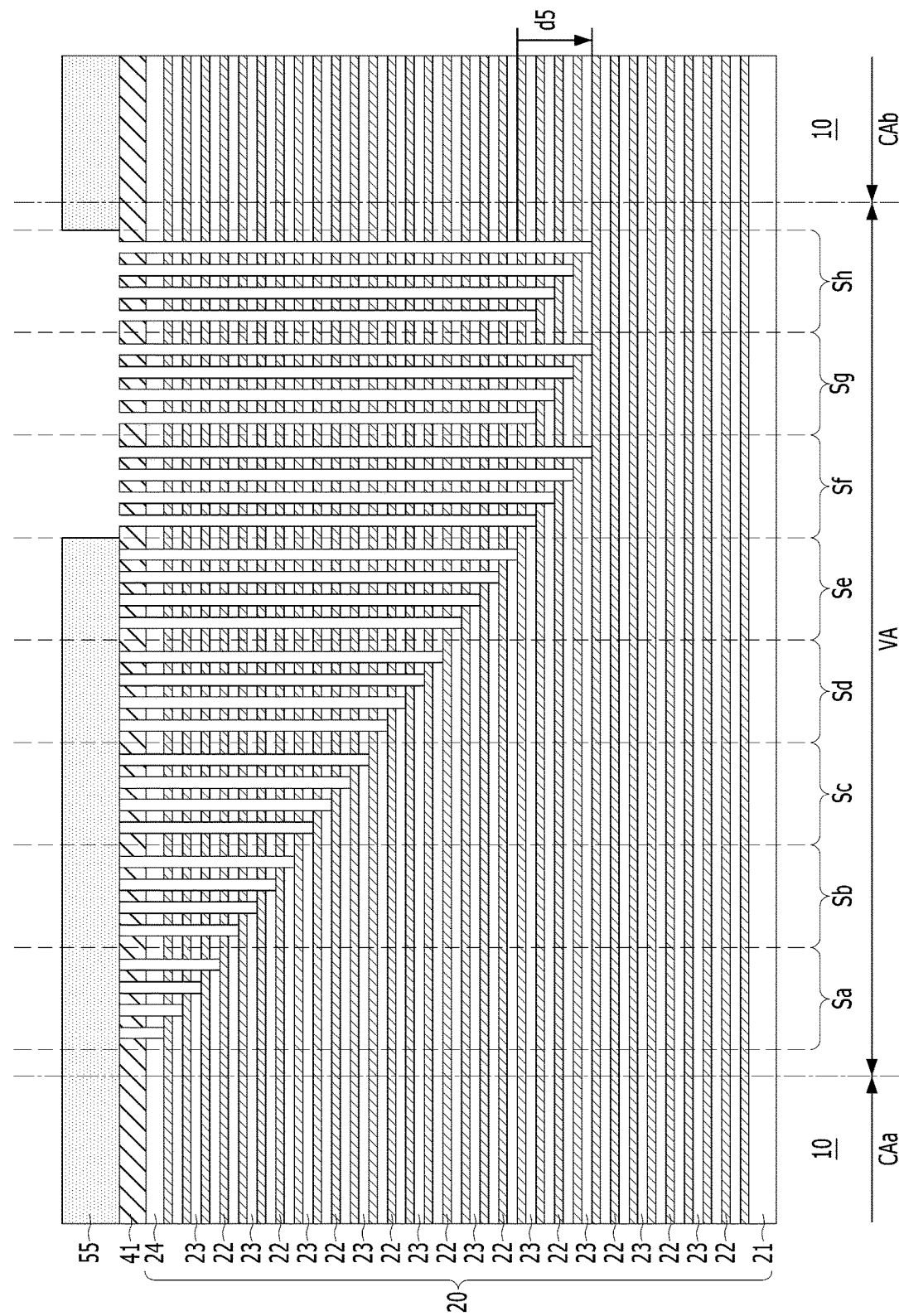
Figure 13:
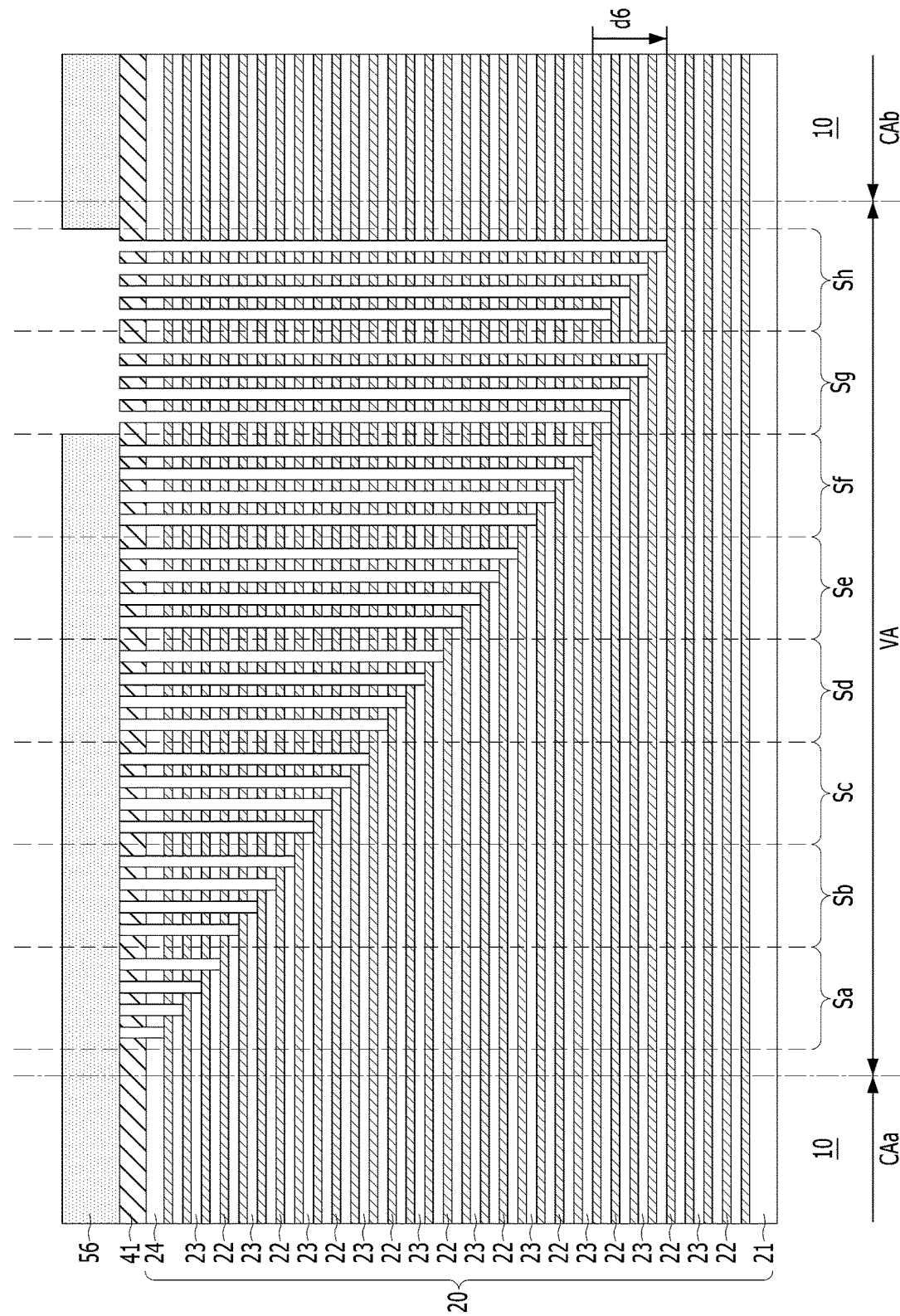
Figure 14:
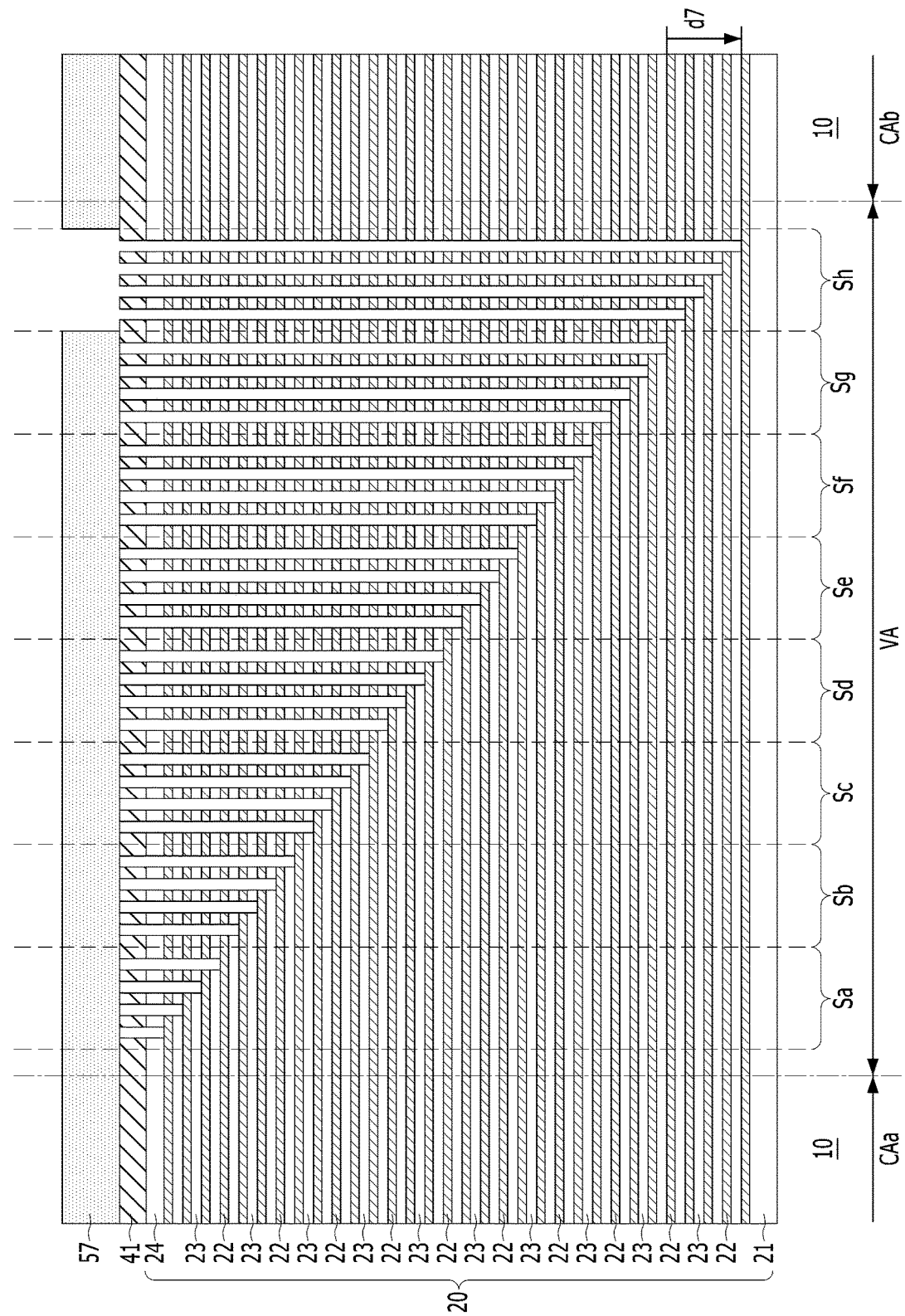

Referring to FIG. 9, the method may further include a second slimming process. The second slimming process may include forming a second mask pattern 52 covering at least two of the sites Sa to Sh (e.g., the first and second sites Sa and Sb), exposing the remaining sites Sc to Sh, and further etching the hole patterns H1 to H4 of the exposed sites Sc to Sh by a second depth d2. In the drawing, the first and second sites Sa and Sb are shown to be adjacent to each other, but in other embodiments, the first and second sites Sa and Sb may be spaced apart from each other. Reference numerals of the hole patterns H1 to H4 have been omitted in order to avoid complicating the drawing. Thereafter, the second mask pattern 52 may be removed and a filling insulating material may be used to fill in the hole patterns.

Referring to FIGS. 10 to 14, the method may further include performing third to seventh slimming processes. The third to seventh slimming processes may include forming third to seventh mask patterns 53 to 57, respectively, that cover and expose some of the sites Sa to Sh, and further etching the hole patterns H1 to H4 the exposed sites Sd to Sh of by one of third to seventh depths d3 to d7. Although sites Sa to Sh are described as adjacent to each other and sequentially exposed in the drawings, adjacent sites do not have to be sequentially exposed. Each of the third to seventh slimming processes may include removing the third to seventh mask patterns 53 to 57 respectively and filling in the hole patterns with a filling insulating material.

Figure 15:
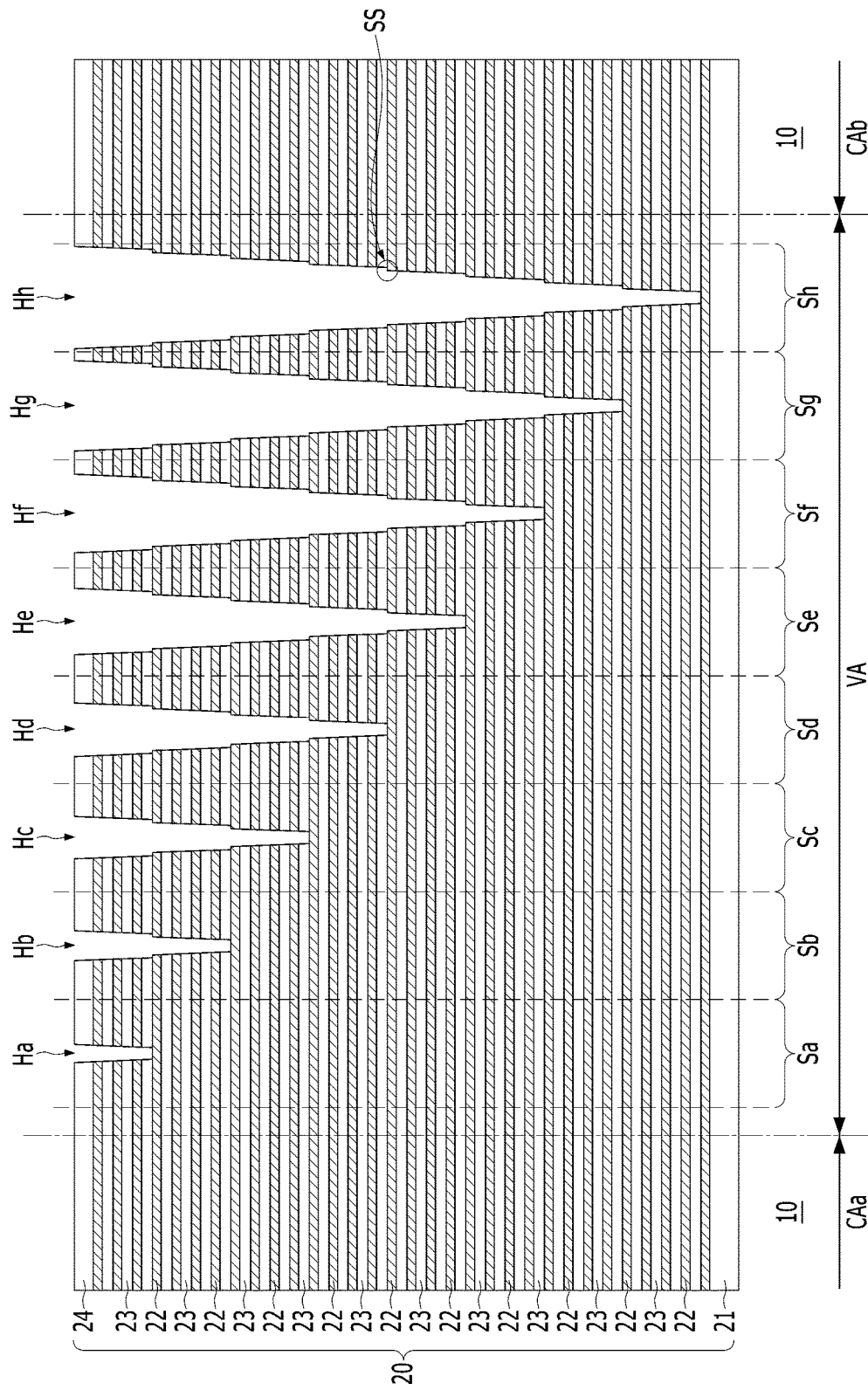

FIG. 15 is a diagram illustrating inner wall profiles of representative hole patterns Ha to Hh formed in each of the sites Sa to Sh. The inner wall profiles have been exaggerated to facilitate understanding of the technical features of the present invention. Referring to FIG. 15, the inner walls of the hole patterns Ha to Hh may be tapered. With further reference to FIGS. 8 to 14, the inner walls of the hole patterns Ha to Hh may have a step shape or a sill shape SS depending on the number of times the above-described slimming processes are performed. The sill shapes SS of the hole patterns Ha to Hh may be formed at the same levels because it is assumed that the slimming processes etch the hole patterns Ha to Hh by the same depths d1 to d7. In other embodiments, however, the depths d1 to d7 of the slimming processes may be different from each other. Accordingly, the sill shapes SS of the hole patterns Ha to Hh may be formed at different levels.

Referring to FIG. 16, the method may further include forming conductive via plugs Vp in the hole patterns Ha to Hh by performing a via plug forming process.

FIGS. 17A and 17B are longitudinal cross-sectional views conceptually illustrating a via plug forming process according to embodiments of the present invention. The sill shapes SS of FIG. 15 are omitted.

Referring to FIGS. 17A and 17B, the via plug forming process may include filling via insulators Vi in the hole patterns Ha to Hh, forming holes exposing each of the sacrificial insulating layers 22 by vertically penetrating the via insulator Vi, filling conductive materials in the holes in the via insulators Vi, and forming the via plugs Vp contacting the sacrificial insulating layers 22, respectively, by performing a planarization process.

Referring to FIG. 17A, the via plugs Vp may have a vertical sidewall profile. For example, the via plugs Vp may have a pillar shape. The via insulators Vi may have a filler shape.

Referring to FIG. 17B, the via plugs Vp may have an inclined sidewall profile. For example, the via plugs Vp may have an inverted cone shape or a stud shape. The via insulators Vi may have a lining shape.

The via insulator Vi may include silicon oxide or metal oxide. The via plugs Vp may include a metal. In FIGS. 17A and 17B, the diameters of the via plugs Vp may be the same. The via plugs Vp are illustrated in an exaggerated form to facilitate understanding of the technical features of the present invention.

Referring to FIG. 18, the method may further include forming the capping layer 25 over the insulating layer stack 20 and forming the word line stack 30 by replacing the sacrificial insulating layers 22 with the word lines 31. The word line stack 30 may include the lower insulating layer 21, the interlayer insulating layers 23 and the word lines 31, which are alternately stacked, and the upper insulating layer 24. The capping layer 25 may include silicon oxide having an etching selectivity with respect to the sacrificial insulating layers 22. The word lines 31 may include a conductor such as a metal.

Thereafter, referring to FIG. 2, the method may further include forming contact plugs 35 vertically penetrating the capping layer 25 and forming metal wirings 36 over the capping layer 25 and the contact plugs 35.

Figure 19A:
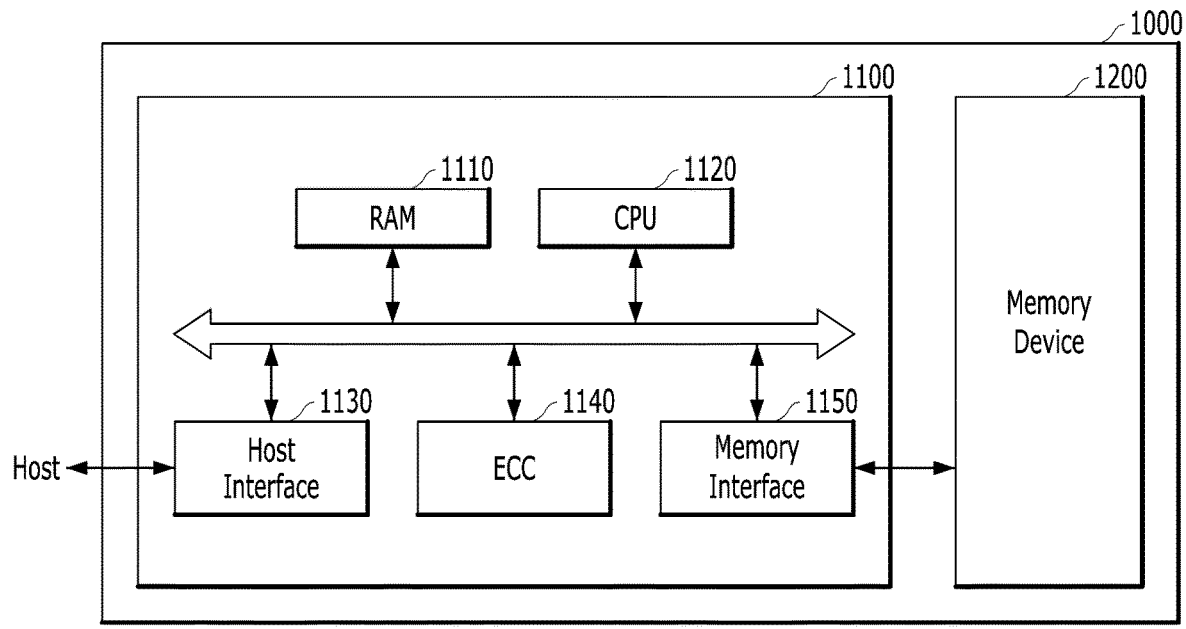
FIGS. 19A and 19B are block diagrams illustrating a configuration of memory systems according to embodiments of the present invention.

FIG. 19A is a block diagram illustrating a configuration of a memory system 1000 according to an embodiment of the present invention. Referring to FIG. 19A, a memory system 1000 according to an embodiment of the present invention may include a memory device 1200 and a controller 1100. The memory device 1200 may store data information having various data types such as text, graphics, and software codes. The memory device 1200 may include a nonvolatile memory. Also, the memory device 1200 may include the three-dimensional semiconductor device described with reference to FIGS. 1A to 2. The controller 1100 may be connected to the host and the memory device 1200. The controller 1100 may access the memory device 1200 in response to a request from the host. For example, the controller 1100 may control operations of the memory device 1200 such as read, write, erase, and background. The controller 1100 may include, for example, a random-access memory (RAM) 1110, a central processing unit (CPU) 1120, a host interface 1130, an error correction code (ECC) circuit 1140, and a memory interface 1150. Here, the RAM 1110 may be used as an operating memory of the CPU 1120, a cache memory between the memory device 1200 and a host, a buffer memory between the memory device 1200 and a host, and the like. For reference, the RAM 1110 may be replaced with static random-access memory (SRAM), read only memory (ROM), or the like. The CPU 1120 may control the overall operation of the controller 1100. For example, the CPU 1120 may operate a firmware such as a flash translation layer (FTL) stored in the RAM 1110. The host interface 1130 may interface with a host. For example, the controller 1100 may communicate with a host through various interface protocols including at least one of USB (Universal Serial Bus) protocol, MMC (Multi-Media Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol, private protocol, and etc. The ECC circuit 1140 may detect and correct an error included in data read from the memory device 1200 using an error correction code ECC. The memory interface 1150 may interface with the memory device 1200. For example, the memory interface 1150 may include a NAND interface or a NOR interface. The buffer memory may temporarily store data transmitted to the outside through the host interface 1130 or may temporarily store data transmitted from the memory device 1200 through the memory interface 1150. In addition, the controller 1100 may further include a ROM that stores code data for interfacing with a host. As described above, the performance of the memory system 1000 may be improved because the memory system 1000 according to an embodiment of the present invention includes the memory device 1200 with improved performance.

Figure 19B:
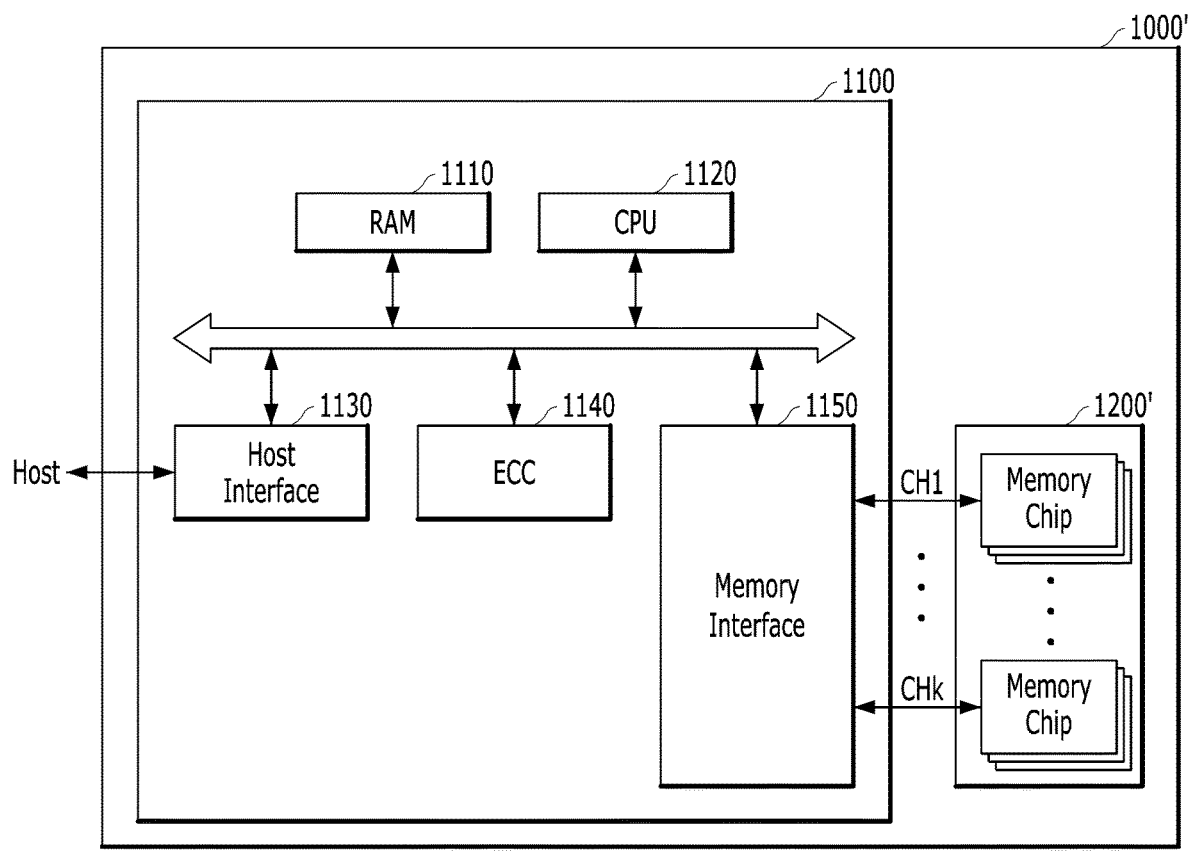

FIG. 19B is a block diagram illustrating a configuration of a memory system 1000' according to an embodiment of the present invention. Hereinafter, duplicate descriptions will be omitted below. Referring to FIG. 19B, the memory system 1000' according to an embodiment of the present invention may include a memory device 1200' and the controller 1100. In addition, the controller 1100 may include a RAM 1110, CPU 1120, host interface 1130, ECC circuit 1140, memory interface 1150, and the like. The memory device 1200' may include a nonvolatile memory. Also, the memory device 1200' may include the three-dimensional semiconductor device described with reference to FIGS. 1A to 2. Also, the memory device 1200' may include a multi-chip package including a plurality of memory chips. The plurality of memory chips may be divided into a plurality of groups, and the plurality of groups may communicate with the controller 1100 through first to k-th channels CH1 to CHk. Also, memory chips belonging to one group may communicate with the controller 1100 through a common channel. For reference, the memory system 1000' may be modified so that one memory chip is connected to one channel. As described above, the performance of the memory system 1000' may also be improved because the memory system 1000' according to an embodiment of the present invention includes the memory device 1200' with improved performance. In particular, the memory device 1200' may have the increased data storage capacity and the improved operation speed because the memory device 1200' includes a multi-chip package.

Figure 19C:
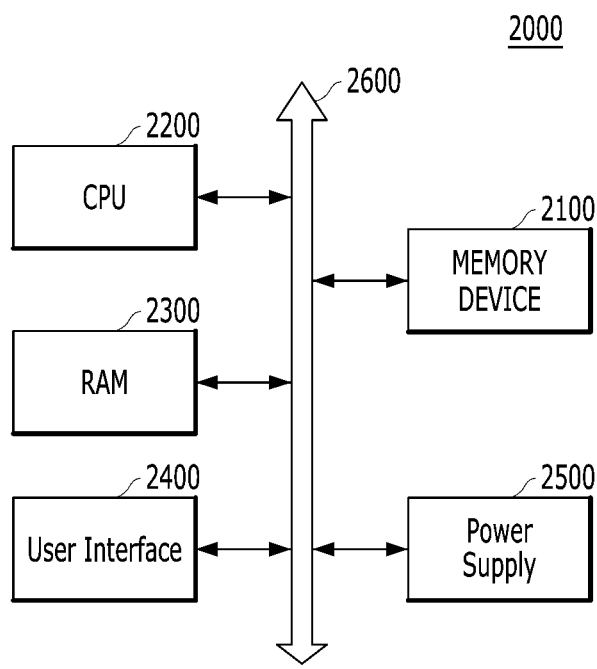
FIGS. 19C and 19D are block diagrams illustrating a configuration of computing systems according to embodiments of the present invention.

FIG. 19C is a block diagram illustrating a configuration of a computing system 2000 according to an embodiment of the present invention. Hereinafter, duplicate descriptions will be omitted below. Referring to FIG. 19C, a computing system 2000 according to an embodiment of the present invention may include a memory device 2100, CPU 2200, RAM 2300, user interface 2400, power supply 2500, and system bus 2600, and the like. The memory device 2100 may store data provided through the user interface 2400 and data processed by the CPU 2200. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, the function of the controller may be performed by the CPU 2200, the RAM 2300, or the like. Here, the memory device 2100 may include a nonvolatile memory. Also, the memory device 2100 may include the three-dimensional semiconductor device described with reference to FIGS. 1A to 2. The computing system 2000 may include a computer, Ultra Mobile PC (UMPC), workstation, netbook, Personal Digital Assistants (PDA), portable computer, web tablet, wireless phone, mobile phone, smart phone, e-book, PMP (Portable Multimedia Player), portable game console, navigation device, black box, digital camera, three-dimensional television, digital audio recorder, digital audio player, digital picture recorder, digital picture player, digital video recorder, digital video player, one of the devices that can transmit and receive information in a wireless environment, one of the various electronic devices that make up a home network, one of the various electronic devices that make up a computer network, one of the various electronic devices that make up a telematics network, or a RFID device. The performance of the computing system 2000 may also be improved because the computing system 2000 according to an embodiment of the present invention includes the memory device 2100 with improved performance.

Figure 19D:
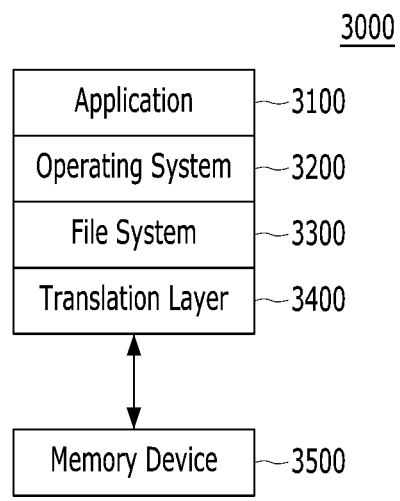

FIG. 19D is a block diagram illustrating a computing system 3000 according to an embodiment of the present invention. Referring to FIG. 19D, a computing system 3000 according to an embodiment of the present invention may include a software layer including an operating system 3200, an application 3100, a file system 3300, a translation layer 3400, and the like. In addition, the computing system 3000 may include a hardware layer such as a memory device 3500. The operating system 3200 may manage software and hardware resources of the computing system 3000 and may control the central processing unit to execute a program. The application 3100 may include various application programs executed by the computing system 3000. For example, the application 3100 may include a utility software executed by the operating system 3200. The file system 3300 refers to a logical structure for managing data, files, and the like existing in the computing system 3000. The file system 3300 may organize the files or data to be stored in the memory device 3500 according to rules. The file system 3300 may be determined depending on the operating system 3200 used for the computing system 3000. For example, when the operating system 3200 is a Windows series of Microsoft Corporation, the file system 3300 may include a File Allocation Table (FAT), an NT file system (NTFS), or the like. In addition, when the operating system 3200 is a Unix/Linux series, the file system 3300 may include an Extended File System (EXT), a Unix File System (UFS), a Journaling File System (JFS), or the like. Although the operating system 3200, the application 3100, and the file system 3300 are described in separate blocks, but the application 3100 and the file system 3300 may be included in the operating system 3200. The translation layer 3400 may translate an address into a format suitable for the memory device 3500 in response to a request from the file system 3300. For example, the translation layer 3400 may convert a logical address generated by the file system 3300 into a physical address of the memory device 3500. Here, mapping information between a logical address and a physical address may be stored in an address translation table. For example, the translation layer 3400 may include a Flash Translation Layer (FTL), a Universal Flash Storage Link Layer (ULL), and the like. The memory device 3500 may include a nonvolatile memory. Also, the memory device 3500 may include the three-dimensional semiconductor device described with reference to FIGS. 1A to 2. The performance of the computing system 3000 may be improved because the computing system 3000 according to an embodiment of the present invention includes the memory device 3500 with improved performance.

Although the technical features of the present invention have been specifically recorded according to the above embodiments, it should be noted that the above embodiments are for the purpose of explanation and not for the limitation of the present invention. In addition, it will be appreciated by one of ordinary skill in the art that various changes and modifications can be made thereto without departing from the scope of the disclosure.

What is claimed is:

1. A three-dimensional semiconductor device comprising:
   a first cell region;
   a second cell region;
   a via plug region between the first cell region and the second cell region, wherein the via plug region includes a first site, a second site, a third site, and a fourth site arranged in a zigzag pattern in a row direction;
   a first via plug disposed in the first site, the first via plug having a first diameter;
   a second via plug disposed in the second site, the second via plug having a second diameter;
   a third via plug disposed in the third site, the third via plug having a third diameter; and
   a fourth via plug disposed in the fourth site, the fourth via plug having a fourth diameter;
   wherein:
   the second diameter is greater than the first diameter,
   the third diameter is greater than the second diameter, and
   the fourth diameter is greater than the third diameter.

2. The three-dimensional semiconductor device of claim 1,
   wherein:
   a vertical length of the second via plug is greater than a vertical length of the first via plug,
   a vertical length of the third via plug is greater than the vertical length of the second via plug, and
   a vertical length of the fourth via plug is greater than the vertical length of the third via plug.

3. The three-dimensional semiconductor device of claim 1, further comprising:
   a fifth via plug disposed in a fifth site between the first site and the second site, the fifth via plug having a fifth diameter;
   a sixth via plug disposed in a sixth site between the second site and the third site, the sixth via plug having a sixth diameter; and
   a seventh via plug disposed in a seventh site between the third site and the fourth site, the seventh via plug having a seventh diameter,
   wherein:
   the fifth diameter is greater than the first diameter,
   the sixth diameter is greater than the second diameter, and
   the seventh diameter is smaller than the third diameter.

4. The three-dimensional semiconductor device of claim 3,
   wherein:
   the fifth diameter is greater than the second diameter,
   the sixth diameter is greater than the third diameter, and
   the seventh diameter is smaller than the fourth diameter.

5. The three-dimensional semiconductor device of claim 3, further comprising:
   an eighth via plug disposed in an eighth site between the fifth site and the second site, the eighth via plug having an eighth diameter;
   a ninth via plug disposed in a ninth site between the sixth site and the third site, the ninth via plug having a ninth diameter; and
   a tenth via plug disposed in a tenth site between the seventh site and the fourth site, the tenth via plug having a tenth diameter,
   wherein:
   the eighth diameter is greater than the second diameter,
   the ninth diameter is smaller than the sixth diameter, and
   the tenth diameter is greater than the seventh diameter.

6. The three-dimensional semiconductor device of claim 5,
   wherein:
   the first site, the third site, the sixth site, the eighth site, and the tenth site is aligned with a first center line which extends in the row direction,
   the second site, the fourth site, the fifth site, the seventh site, and the ninth site is aligned with a second center line which extends in the row direction, and
   the first center line and the second center line are parallel with each other.

7. The three-dimensional semiconductor device of claim 5,
   wherein vertical lengths of the first to tenth via plugs are different from one another.

8. The three-dimensional semiconductor device of claim 1, further comprising:
   a word line stack in the first cell region, the via plug region, and the second cell region,
   wherein the word line stack includes:
   a plurality of word lines which extend in a horizontal direction and stacked in a vertical direction; and a plurality of interlayer insulating layers disposed between the plurality of word lines, respectively, wherein each of the first to fourth via plugs vertically passes through the word line stack to be exclusively connected to word lines, respectively.

9. A three-dimensional semiconductor device comprising:
a first cell region;
a via plug region adjacent to the first cell region; and
a first via plug, a second via plug, a third via plug, a fourth via plug, a fifth via plug, a sixth via plug and a seventh via plug disposed in the via plug region, wherein the first to seventh via plugs are disposed in a zigzag pattern in a row direction in a top view,
wherein:
a fifth via plug between the first via plug and the second via plug;
a sixth via plug between the second via plug and the third via plug; and
a seventh via plug between the third via plug and the fourth via plug,
wherein:
the first via plug has a first diameter,
the second via plug has a second diameter,
the third via plug has a third diameter,
the fourth via plug has a fourth diameter,
the fifth via plug has a fifth diameter,
the sixth via plug has a sixth diameter,
the seventh via plug has a seventh diameter,
the second diameter is greater than the first diameter,
the third diameter is greater than the second diameter,
the fourth diameter is greater than the third diameter,
the fifth diameter is greater than the first diameter,
the sixth diameter is greater than the second diameter, and
the seventh diameter is smaller than the third diameter.

10. The three-dimensional semiconductor device of claim 9, wherein:
a vertical length of the second via plug is greater than a vertical length of the first via plug,
a vertical length of the third via plug is greater than a vertical length of the second via plug, and
a vertical length of the fourth via plug is greater than a vertical length of the third via plug.

11. The three-dimensional semiconductor device of claim 9,
wherein:
the fifth diameter is greater than the second diameter,
the sixth diameter is greater than the third diameter, and
the seventh diameter is smaller than the fourth diameter.

12. The three-dimensional semiconductor device of claim 11, further comprising:
an eighth via plug between the fifth via plug and the second via plug, the eighth via plug having an eighth diameter;
a ninth via plug between the sixth via plug and the third via plug, the ninth via plug having a ninth diameter; and
a tenth via plug between the seventh via plug and the fourth via plug, the tenth via plug having a tenth diameter, wherein:
the eighth diameter is greater than the second diameter,
the ninth diameter is smaller than the sixth diameter, and
the tenth diameter is greater than the seventh diameter.

13. The three-dimensional semiconductor device of claim 12,
wherein:
the first via plug, the third via plug, the sixth via plug, the eighth via plug, and the tenth via plug are aligned with a first center line extending in the row direction, and
the second via plug, the fourth via plug, the fifth via plug, the seventh via plug, and the ninth via plug are aligned with a second center line extending in the row direction,
wherein the first center line and the second center line are parallel with each other.

14. The three-dimensional semiconductor device of claim 12,
wherein vertical lengths of the first to tenth via plugs are different from one another.

15. A three-dimensional semiconductor device comprising:
a first cell region;
a second cell region;
a via plug region between the first cell region and the second cell region, wherein the via plug region includes first to eighth via plugs arranged in a zigzag pattern in a row direction,
wherein:
the first to eighth via plugs have first to eighth diameters, respectively,
the second to seventh diameters are greater than or equal to the first diameter,
the second to seventh diameters are smaller than or equal to the eight diameter, and
the eight diameter is greater than the first diameter.

16. The three-dimensional semiconductor device of claim 15,
wherein:
the second diameter is greater than the first diameter,
the third diameter is greater than the second diameter, and
the eighth diameter is greater than the fourth diameter.

17. The three-dimensional semiconductor device of claim 15,
wherein:
the third diameter is greater than the fourth diameter, and
the fifth diameter is greater than the sixth diameter.

18. The three-dimensional semiconductor device of claim 15,
wherein the seventh diameter is greater than the sixth diameter.

19. The three-dimensional semiconductor device of claim 15,
wherein the first diameter is equal to the sixth diameter.

* * * * *